(12) United States Patent
Sugimura

(10) Patent No.: US 8,222,159 B2
(45) Date of Patent: Jul. 17, 2012

(54) MANUFACTURING METHOD OF SEMICONDUCTOR DEVICE

(75) Inventor: Takashi Sugimura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 336 days.

(21) Appl. No.: 12/545,328

(22) Filed: Aug. 21, 2009

(65) Prior Publication Data

US 2010/0048024 A1 Feb. 25, 2010

(30) Foreign Application Priority Data

Aug. 25, 2008 (JP) ................. P2008-215609

(51) Int. Cl.
*H01L 21/302* (2006.01)
*H01L 21/461* (2006.01)
(52) U.S. Cl. ........ 438/736; 438/262; 438/696; 438/702; 438/717; 438/738; 438/761; 438/763; 438/946; 438/947
(58) Field of Classification Search .................. 438/262, 438/696, 702, 717, 736, 738, 761, 763, 946, 438/947
See application file for complete search history.

(56) References Cited

U.S. PATENT DOCUMENTS

| | | | | |
|---|---|---|---|---|
| 6,063,688 A | * | 5/2000 | Doyle et al. | .................. 438/424 |
| 7,291,560 B2 | | 11/2007 | Parascandola et al. | |
| 7,572,572 B2 | * | 8/2009 | Wells | .............................. 430/311 |
| 7,651,951 B2 | * | 1/2010 | Tran et al. | ...................... 438/738 |
| 7,842,558 B2 | * | 11/2010 | Juengling | ..................... 438/135 |
| 7,884,022 B2 | * | 2/2011 | Bai et al. | ........................ 438/702 |
| 7,939,409 B2 | * | 5/2011 | Figura et al. | .................. 438/259 |
| 2007/0049030 A1 | * | 3/2007 | Sandhu et al. | ............... 438/689 |

FOREIGN PATENT DOCUMENTS

| | | |
|---|---|---|
| JP | 2001-156283 | 6/2001 |
| JP | 2001-156283 | 8/2001 |
| JP | 2007-043156 | 2/2007 |
| WO | 2006/127586 | 11/2006 |
| WO | 2007/030343 | 3/2007 |

OTHER PUBLICATIONS

Japanese Official Action—2009-194581—Feb. 28, 2012.

* cited by examiner

*Primary Examiner* — Bac Au
(74) *Attorney, Agent, or Firm* — Young & Thompson

(57) ABSTRACT

A manufacturing method of semiconductor device comprises: sequentially laminating a third mask layer, a second mask layer, and a first mask layer on a processed layer; forming a fourth mask layer on the first mask layer; processing the first mask layer so as to have a line pattern form using the fourth mask layer as a mask; removing the first mask layer; processing the second mask layer so as to have a pair of line pattern forms using the pair of sidewall layers as a mask; forming a fifth mask layer on the third mask layer; forming a pair of opening portions in the third mask layer using the fifth mask layer as a mask; and forming a pair of groove portions on the processed layer using the third mask layer as a mask.

19 Claims, 18 Drawing Sheets

MANUFACTURING METHOD OF SEMICONDUCTOR DEVICE

BACKGROUND OF THE INVENTION

1. Field of the Invention

The present invention relates to a manufacturing method of semiconductor device that uses a sidewall double patterning technology (sidewall DPT).

Priority is claimed on Japanese Patent Application No. 2008-215609, filed Aug. 25, 2008, the content of which is incorporated herein by reference.

2. Description of Related Art

In the semiconductor device fabrication process, an optical projection exposure apparatus (hereinafter, referred to as an exposure apparatus) is broadly used as an apparatus for forming circuit patterns on a wafer. An exposure apparatus usually has therein a plurality of optical conditions, and the optical conditions are determined by the size, shape, and arrangement of the patterns to be exposed. For example, related illumination is used for sparse patterns having a lower integration level, whereas annular illumination is mainly used for dense patterns having a higher level of repetition as in the case of DRAM (dynamic random access memory) cells.

Moreover, with the trend of miniaturization and high performance of semiconductor devices, the patterns used on a circuit come in many and various forms. In related DRAM cells, patterns having an identical form that repeat at equal intervals were the mainstream patterns; however, many of the recent patterns lack repetitiveness, and hence, it is difficult to form a desired pattern by mere optimization of optical conditions.

When patterns lacking in repetitiveness are formed by an exposure apparatus, the light intensity distribution of the light transmitted through the pattern formed on a reticle becomes asymmetric with respect to the central line of the pattern. Therefore, the pattern formed on a wafer is likely to deviate from the position at which the pattern is to be formed.

When a trench gate pattern is formed on a Si substrate during the fabrication step of DRAMs having trench-gate MOS transistors, a positional deviation due to the asymmetric profile occurs.

SUMMARY

In one embodiment, there is provided a manufacturing method of semiconductor device, that includes at least: sequentially laminating a third mask layer, a second mask layer, and a first mask layer on a processed layer; forming a fourth mask layer comprising a line pattern on the first mask layer by photolithography that uses a reticle; processing the first mask layer so as to have a line pattern form corresponding to the line pattern of the fourth mask layer by partially etching the first mask layer using the fourth mask layer as a mask; forming a pair of sidewall layers on both sides in the line-width direction of the first mask layer and subsequently etching and removing the first mask layer; processing the second mask layer so as to have a pair of line pattern forms corresponding to the pair of sidewall layers by partially etching the second mask layer using the pair of sidewall layers as a mask; forming a fifth mask layer having a different etching selectivity from that of the second mask layer, on the third mask layer which is exposed due to the processing of the second mask layer; forming a pair of opening portions which correspond to the pair of line patterns of the second mask layer, in the third mask layer by etching and removing the second mask layer and subsequently partially etching the third mask layer using the fifth mask layer as a mask; and forming a pair of groove portions on the processed layer by partially etching the processed layer using the third mask layer in which the pair of opening portions are formed as a mask.

In another embodiment, there is provided a manufacturing method of semiconductor device, that includes at least: forming at least one active region group on a semiconductor substrate, the active region group comprising a plurality of elliptical active regions surrounded by an element separation region, where a first direction is defined along the direction of the longer diameter of the elliptical active regions, and the plurality of active regions are arranged at equal intervals in a second direction intersecting the first direction; forming a mask layer on the surface of the semiconductor substrate; forming at least one first pattern having a line form on the mask layer so as to extend over the plurality of active regions constituting the active region group; processing the mask layer using the first pattern as a base to form a plurality of second patterns at positions on both sides of and in contact with the first pattern; forming a plurality of trenches on the semiconductor substrate within the active regions using the second patterns as a mask; and forming a gate electrode in the trenches to form a plurality of trench-gate MOS transistors in the active regions constituting the active region group.

BRIEF DESCRIPTION OF THE DRAWINGS

The above features and advantages of the present invention will be more apparent from the following description of certain preferred embodiments taken in conjunction with the accompanying drawings, in which:

FIG. 20A is a schematic top plan view illustrating the main parts of the reticle, FIG. 20B is a graph illustrating the light intensity distribution of the exposure light which has passed through the reticle, and FIG. 20C is an enlarged view of a part of FIG. 20B;

FIG. 29A is a schematic top plan view illustrating the main parts of the reticle, FIG. 29B is a graph illustrating the light intensity distribution of the exposure light which has passed through the reticle, and FIG. 29C is an enlarged view of a part of FIG. 29B;

DETAILED DESCRIPTION OF THE PREFERRED EMBODIMENTS

Before describing the present invention, the related art will be explained again in detail with reference to FIGS. 20A to 20C, 21, 22, 23, 24, 25A, 25B, 26A to 26C, 27A to 27D, 28, 29A to 29C, 30, 31, 32, and 33, in order to facilitate the understanding of the present invention.

Referring to FIGS. 20 to 24, a method for forming a simple line and space pattern (hereinafter, referred to as a simple L/S pattern) is illustrated. This method for forming the simple L/S pattern is applied for forming the gate electrodes (word lines) of a planar MOS transistor.

Figure 20A:
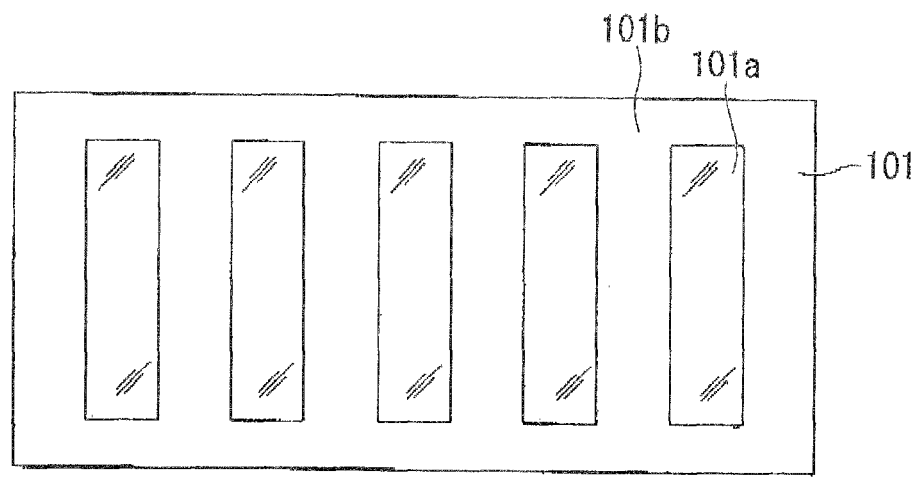
FIGS. 20A to 20C are views showing a related method for forming a simple L/S pattern, where
Figure 20B:
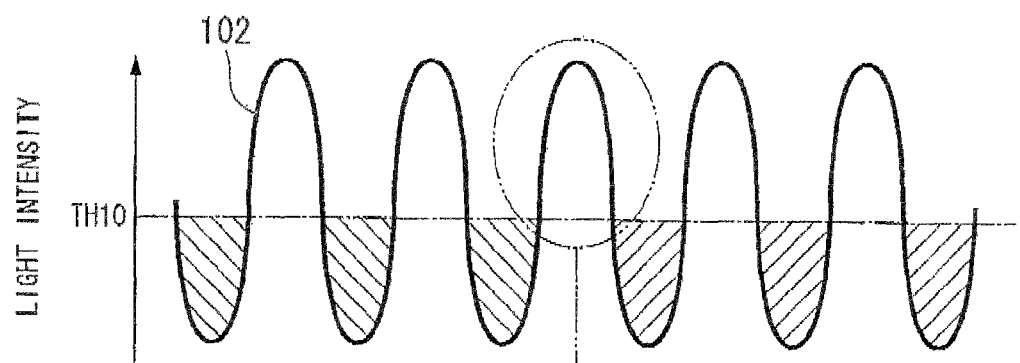
Figure 20C:
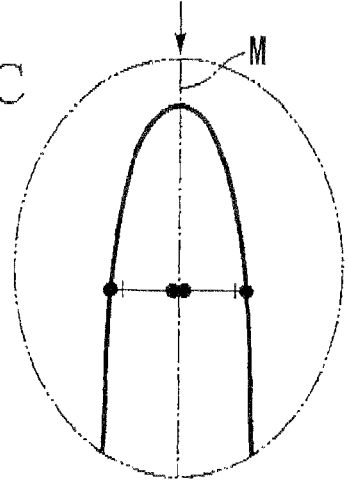

The method for forming the simple L/S pattern on a Si substrate uses a reticle 101 having a desired L/S pattern is illustrated in FIG. 20A. The reticle 101 has such a configuration that a light shielding portion 101b composed of a mask pattern of Cr, for example, is formed on a quartz substrate. The reticle 101 illustrated in FIGS. 20A to 20C is configured such that a light transmitting portion 101a transmits exposure light therethrough and the light shielding portion 101b blocks exposure light. The intensity distribution of the light having passed through the light transmitting portion 101a of the reticle 101 exhibits a wavelike curve indicated by symbol 102 in FIG. 20B. In FIG. 20B, the horizontal axis corresponds to the position in the width direction of the reticle 101, and the vertical axis corresponds to the relative light intensity of the transmitted light. Since the pattern of the light transmitting portion 101a on the reticle 101 is composed of lines and spaces, the curve 102 representing the light intensity distribution will be a repetition of waveforms which maintain symmetry with respect to the central line M of the pattern as illustrated in FIG. 20C.

Figure 21:
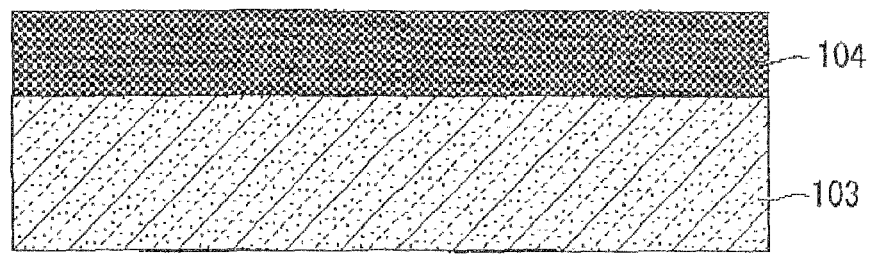
FIG. 21 is a schematic cross-sectional view showing the related method for forming the simple L/S pattern.
Figure 22:
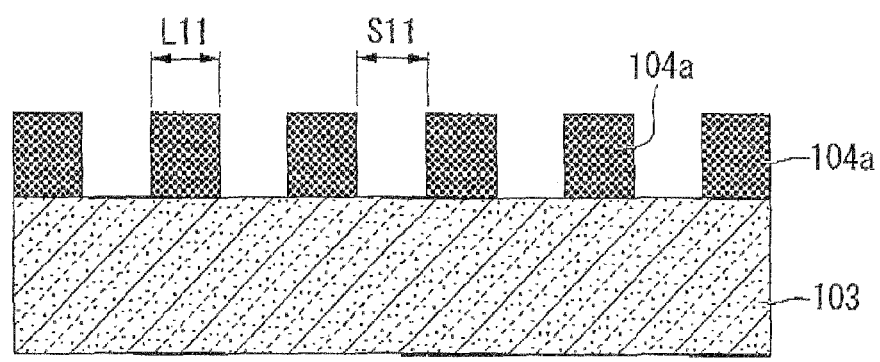
FIG. 22 is a schematic cross-sectional view showing the related method for forming the simple L/S pattern.

According to a process of forming a pattern on a Si substrate using such a reticle 101, as illustrated in FIG. 21, a positive photoresist 104 is first deposited on a Si substrate 103. Then, the L/S pattern on the reticle 101 is exposed to the positive photoresist 104 by an exposure apparatus. Of the light intensity distribution curve 102 of the light having passed through the reticle 101, the positive photoresist 104 positioned at a position corresponding to a light intensity equal to or higher than a certain threshold value TH10 will be dissolved by a development process, and the positive photoresist 104 positioned at a position corresponding to a light intensity lower than the threshold value TH10 will remain on the Si substrate 103. In this way, an L/S pattern 104a as illustrated in FIG. 22 is formed, which is a repetition of a line width L11 and a space width S11.

Figure 23:
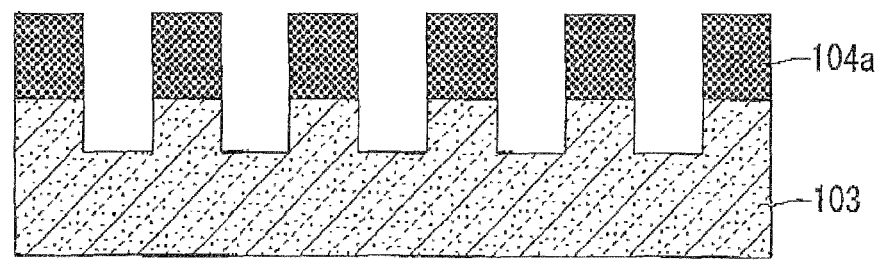
FIG. 23 is a schematic cross-sectional view showing the related method for forming the simple L/S pattern.
Figure 24:
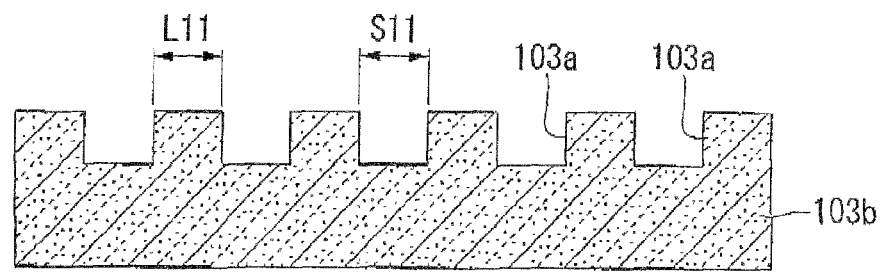
FIG. 24 is the schematic cross-sectional view showing the related method for forming the simple L/S pattern.

Next, as illustrated in FIG. 23, a Si etching is performed on the Si substrate 103 using the formed L/S pattern 104a as a mask. Thereafter, the L/S pattern 104a is removed as illustrated in FIG. 24. In this way, a Si substrate 103b having a groove pattern 103a corresponding to the L/S pattern of the reticle 101 is obtained.

A specific example of forming a planar MOS transistor in a DRAM memory cell using the L/S pattern will be described with reference to FIGS. 25A and 25B, and 26A and 26B.

Figure 25A:
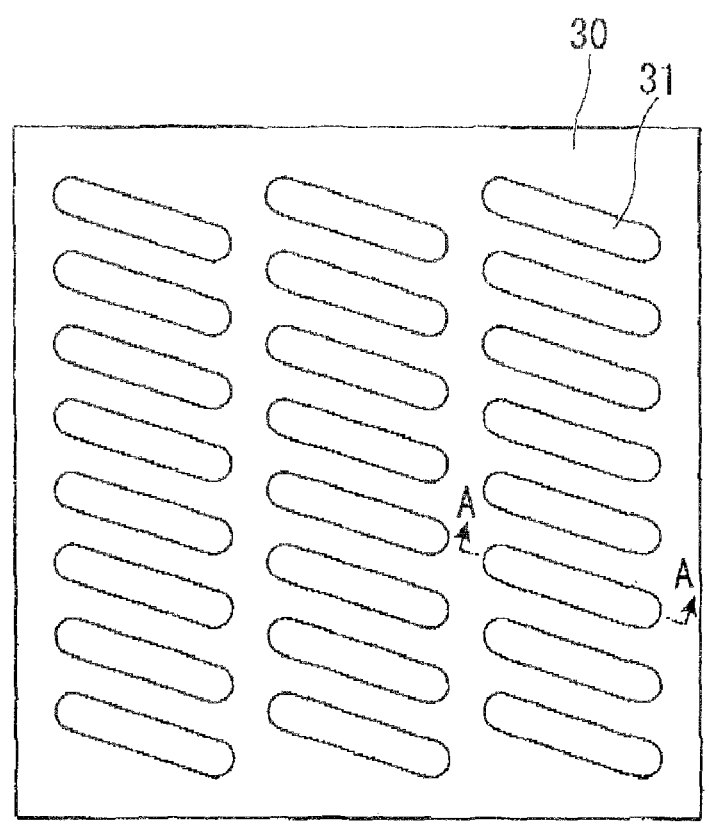
FIGS. 25A and 25B are a top plan view and a schematic cross-sectional view, respectively, showing the related manufacturing method of semiconductor device.
Figure 25B:
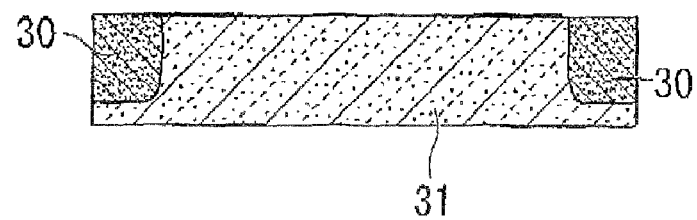

FIG. 25A is a top plan view illustrating an example of a layout of active regions 31 in a DRAM memory cell region. The active regions 31 are regularly arranged in the vertical and horizontal directions. The respective active regions 31 are surrounded by an element separation region 30 so that they are electrically isolated from each other. FIG. 25B illustrates the A-A cross section in FIG. 25A. The element separation region 30 surrounding the active region 31 is configured of an insulating film that buries a groove formed in a silicon substrate.

Figure 26A:
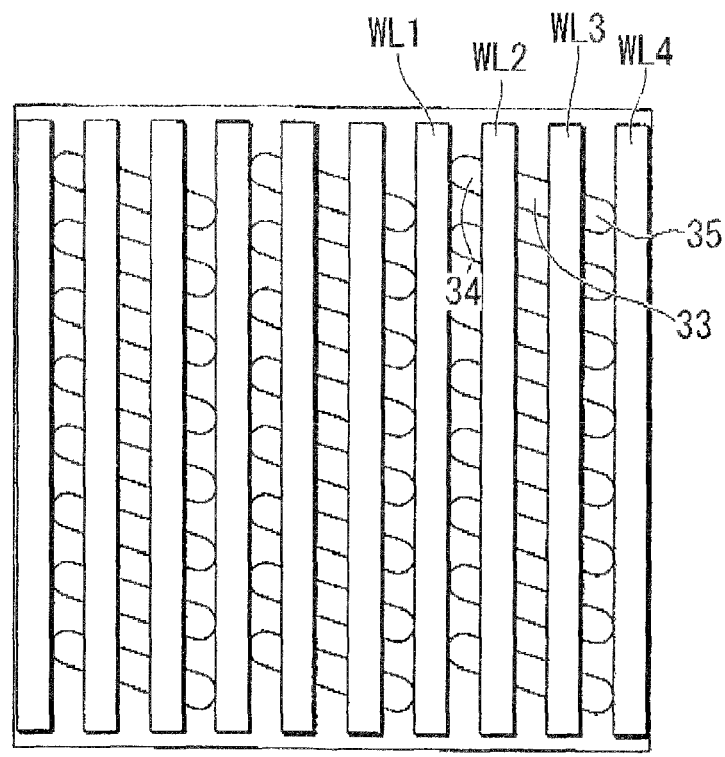
FIG. 26A and FIGS. 26B and 26C are a top plan view and schematic cross-sectional views, respectively, showing the related manufacturing method of semiconductor device.
Figure 26B:
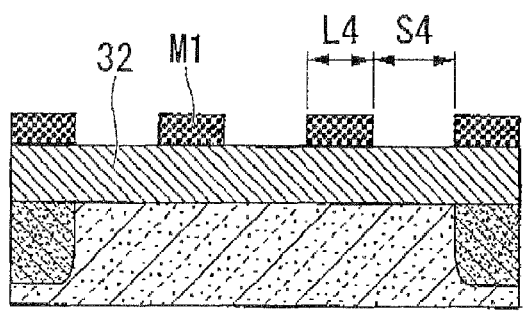
Figure 26C:
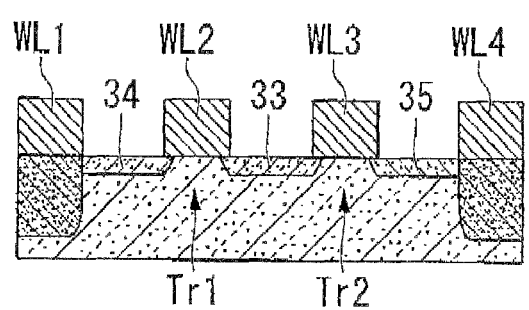

Subsequently to FIGS. 25A and 25B, FIGS. 26A and 26B illustrate a state where an MOS transistor is formed in a memory cell region. FIG. 26A is a top plan view and FIGS. 26B and 26C are cross-sectional views of the A-A section. After the active regions are formed in FIGS. 25A and 25B, a gate insulating film (not illustrated) is formed on the top surfaces of the active regions, and a gate electrode material 32 is formed on the entire surface of the silicon (semiconductor) substrate as illustrated in FIG. 26B. Thereafter, a photoresist mask M1 is formed by a lithography method. The photoresist mask M1 is formed of an L/S pattern composed of lines L4 and spaces S4. The lines L4 and the spaces S4 are formed at equal intervals. Next, as illustrated in FIG. 26C, the gate electrode material 32 is dry-etched using the photoresist mask M1 to form gate electrodes. After removing the photoresist mask M1, a drain diffusion layer 33 and source diffusion layers 34 and 35 are formed by an ion implantation method. In this way, a transistor Tr1 is formed by a gate electrode WL2, the source diffusion layer 34, and the drain diffusion layer 33, and a transistor Tr2 is formed by a gate electrode WL3, the source diffusion layer 35, and the drain diffusion layer 33. That is to say, two planar gate MOS transistors which share the drain diffusion layer 33 are formed in one active region. Referring to the top plan view of FIG. 26A, the respective gate electrodes are formed so as to extend in a direction intersecting a plurality of active regions, thereby constituting word lines WL1, WL2, WL3, and WL4. The respective word lines form an L/S pattern composed of lines L4 and spaces S4 which are identical to each other and are disposed at equal intervals.

Hitherto, the above-described planar gate MOS transistors have hitherto been used as the mainstream technology. However, with the trend of miniaturization of semiconductor elements, in the planar gate MOS transistors, the gate length (which corresponds to the lines L4 described above) is becoming shorter, and hence, the problem of short channel effect becomes an issue. To obviate this problem, a trench gate structure capable of increasing the effective channel length has been used. A trench-gate MOS transistor will be described below.

Figure 27A:
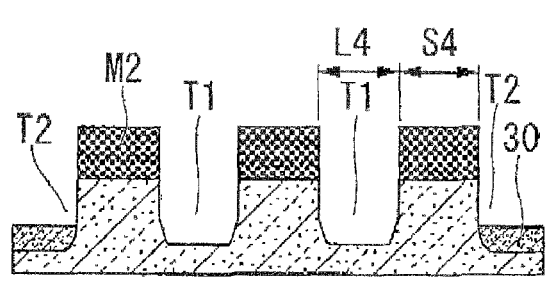
FIGS. 27A to 27D are a series of schematic cross-sectional views showing the related manufacturing method of semiconductor device.
Figure 27C:
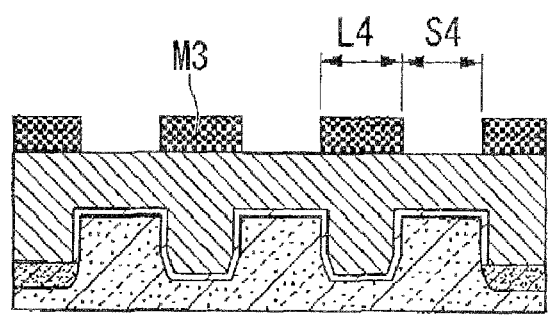
Figure 27B:
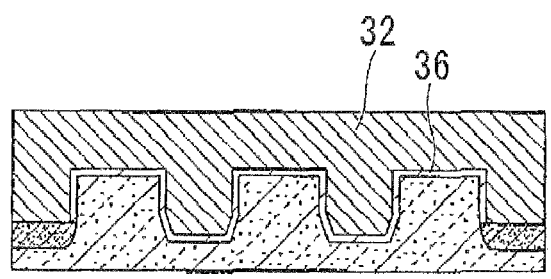

FIGS. 27A to 27D are a series of schematic cross-sectional views illustrating a method for fabricating a trench-gate MOS transistor. In FIGS. 25A and 25B, after the active regions 31 surrounded by the element separation region 30 are formed, the silicon substrate within each of the active regions is dry-etched to form a trench T1 using a mask pattern M2 in which lines and spaces are reversed from those of the L/S pattern used for forming the word lines, as illustrated in FIG. 27A. In this case, the trench T1 has a width L4 identical to the width S4 of the mask M2 and occurs at equal intervals. During the formation of the trench T1, the element separation region 30 is also dry-etched to form a trench T2. Next, as illustrated in FIG. 27B, a gate insulating film 36 is formed on the top surface of the active region and a gate electrode material 32 is subsequently formed on the entire surface.

Figure 27D:
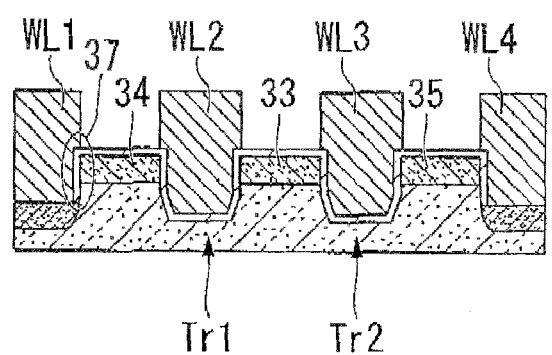

Next, as illustrated in FIG. 27C, a mask pattern M3 composed of lines L4 and spaces S4 which are identical to each other and are disposed at equal intervals is formed so as to correspond to word lines. Next, as illustrated in FIG. 27D, the gate electrode material is dry-etched using the mask pattern M3 as a mask to form trench gate electrodes which serve as word lines WL1, WL2, WL3, and WL4. Thereafter, a shared drain diffusion layer 33 and source diffusion layers 34 and 35 are formed. In this way, two trench-gate MOS transistors Tr1 and Tr2 are formed in one active region. Since the trench-gate transistor is able to increase its channel length, it is possible to suppress the short channel effect. However, as illustrated in FIG. 27D, since the element separation region 30 is also etched, the word lines WL1 and WL4 are in contact with side walls 37 of a plurality of adjacent active regions via only a gate insulating film. Therefore, there is a problem that the parasitic capacitance of the word lines increases, thus making semiconductor devices unable to perform high-speed operations or making voltage withstand failures likely to occur in the gate insulating film, so that sources of adjacent active regions are short-circuited via word lines, resulting in malfunction.

Figure 28:
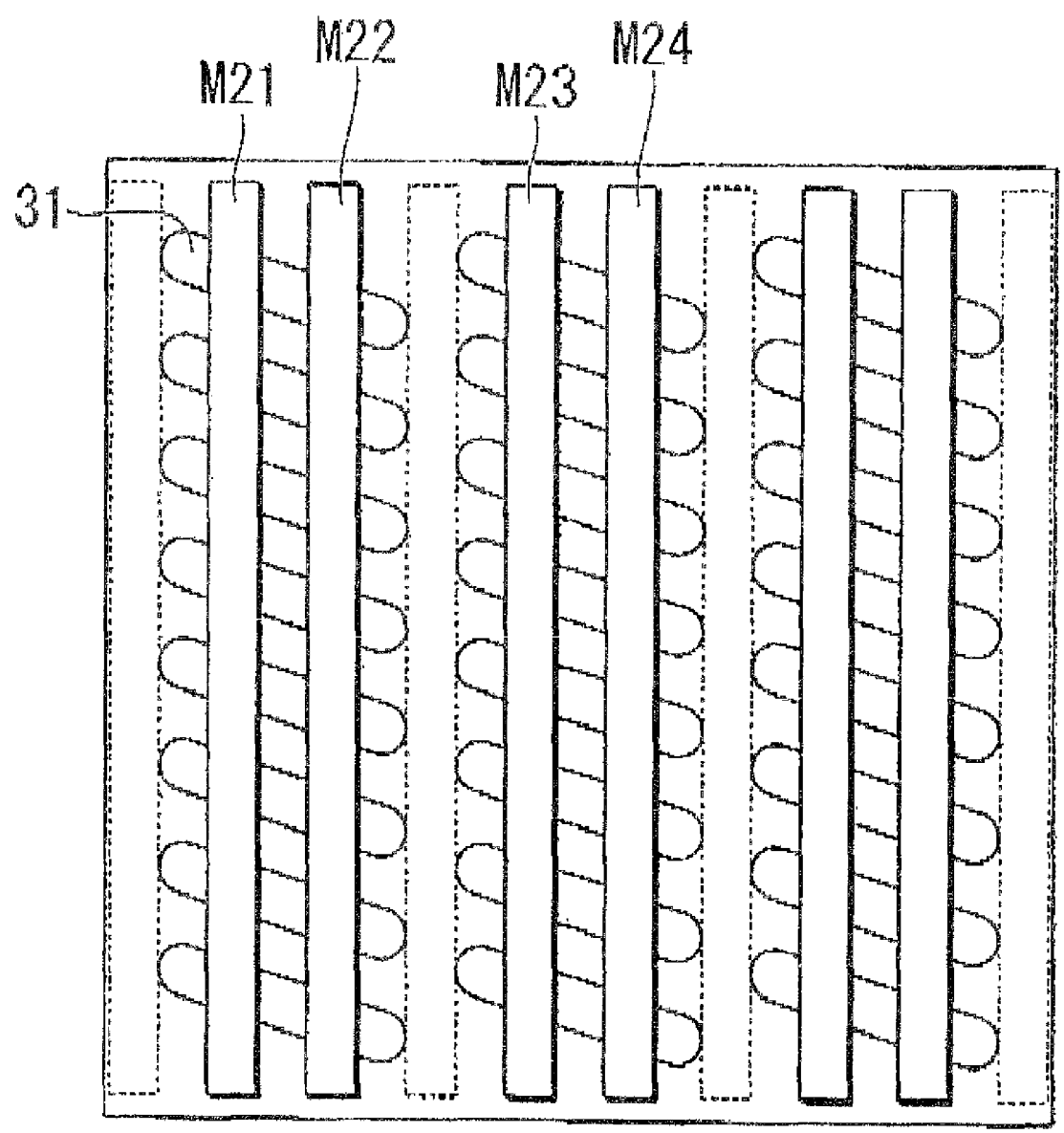
FIG. 28 is a top plan view showing the related manufacturing method of semiconductor device.

To obviate the described problem of the trench-gate MOS transistors, it is considered effective to form trenches using such a mask that pairs of trenches M21 and M22, and M23 and M24 are each formed in only the active regions and the trenches are not formed in the element separation region, as illustrated in the top plan view of FIG. 28. However, in this case, the lithography characteristics are changed due to non-uniformity of the pattern arrangement, and thus, it is difficult to form natural patterns (in terms of design). Hereinafter, the changes in the optical characteristics of the lithography will be described.

Figure 29A:
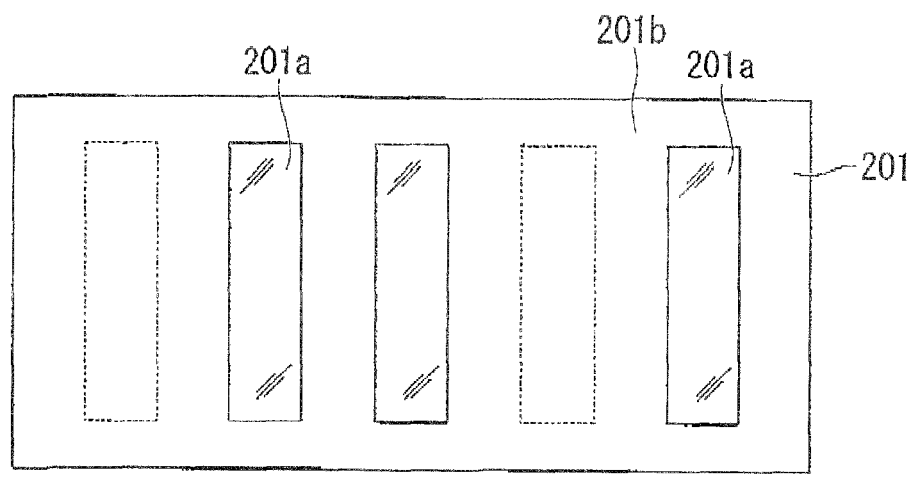
FIGS. 29A to 29C are views showing a related method for forming a pair of trench patterns, where

When a pair of trenches is formed, as illustrated in FIG. 29A, a reticle 201 is used which has such a pattern that one out of three spaces is removed from the simple L/S pattern. That is to say, the reticle 201 illustrated in FIGS. 29A to 29C has such a configuration that a light transmitting portion 201a transmits exposure light therethrough and a light shielding portion 201b blocks exposure light. Moreover, two adjacent light transmitting portions 201a are paired, and this pair of light transmitting portions 201a corresponds to a pair of trenches which is formed within one active region.

Moreover, on both sides of the pair of light transmitting portions 201a, the portions illustrated being surrounded by the one-dot chain lines are portions which correspond to the element separation regions between adjacent active regions, for example. These portions also correspond to portions of the simple L/S pattern in FIG. 20 where the light transmitting portions 201a are arranged.

Figure 29B:
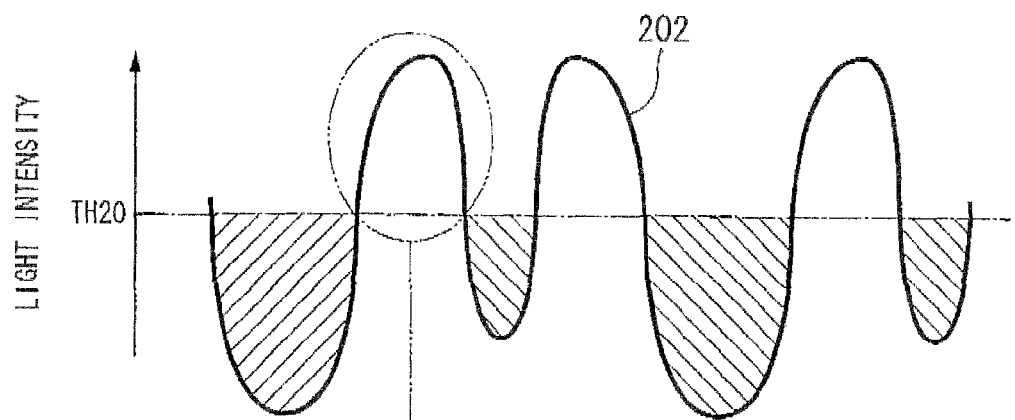
Figure 29C:
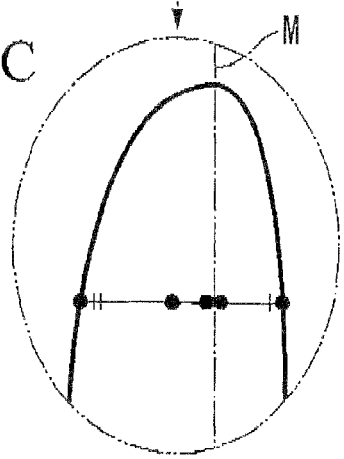

The light intensity distribution of the light having passed through the light transmitting portion 201a of the reticle 201 exhibits a wavelike curve indicated by symbol 202 in FIG. 29B. In FIG. 29B, the horizontal axis corresponds to the position in the width direction of the reticle 201, and the vertical axis corresponds to the relative light intensity of the transmitted light. The curve 202 representing the light intensity distribution becomes a repetition of asymmetric waveforms unlike the case of the simple L/S pattern. That is to say, as illustrated in FIG. 29C, the curve 202 having a light intensity equal to or higher than a threshold value TH20 has a shape asymmetric with respect to the central line M of the pattern.

Figure 30:
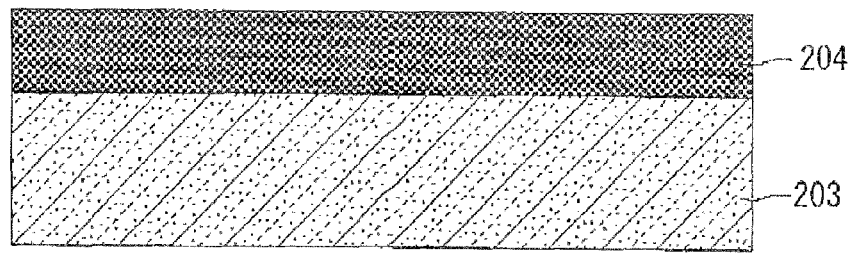
FIG. 30 is a schematic cross-sectional view showing the related method for forming the pair of trench patterns.
Figure 31:
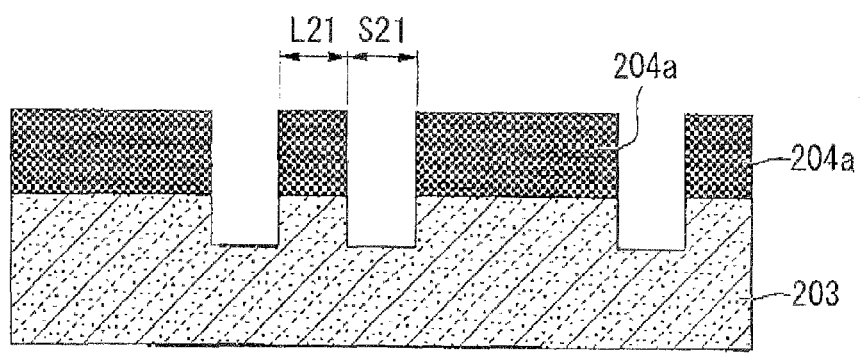
FIG. 31 is a schematic cross-sectional view showing the related method for forming the pan of trench patterns.

According to a process of forming a pattern of trenches on a Si substrate using such a reticle 201, as illustrated in FIG. 30, a positive photoresist 204 is first deposited on a Si substrate 203. Then, the pattern on the reticle 201 is exposed to the positive photoresist 204 by an exposure apparatus. Of the light intensity distribution curve 202 of the light having passed through the reticle 201, the positive photoresist 204 positioned at a position corresponding to a light intensity equal to or higher than the threshold value TH20 will be dissolved by a development process, and the positive photoresist 204 positioned at a position corresponding to a light intensity lower than the threshold value TH20 will remain on the Si substrate 203. In this way, a pattern 204a as illustrated in FIG. 31 is formed, which is a repetition of the line width L21 and the space width S21.

Figure 32:
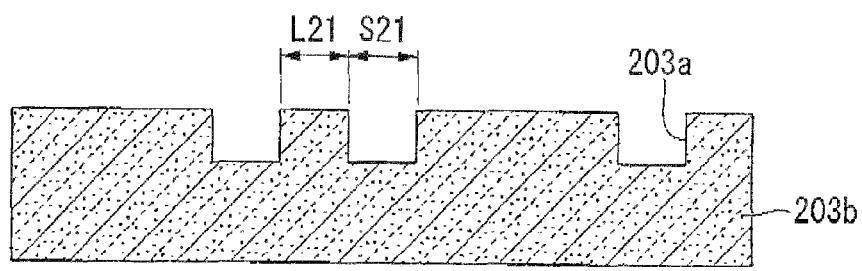
FIG. 32 is a schematic cross-sectional view showing the related method for forming the pair of trench patterns.

Next, a Si etching is performed on the Si substrate 203 using the formed pattern 204a as a mask, and thereafter, the pattern 204a is removed. In this way, a Si substrate 203b having a trench pattern 203a illustrated in FIG. 32 is obtained.

Figure 33:
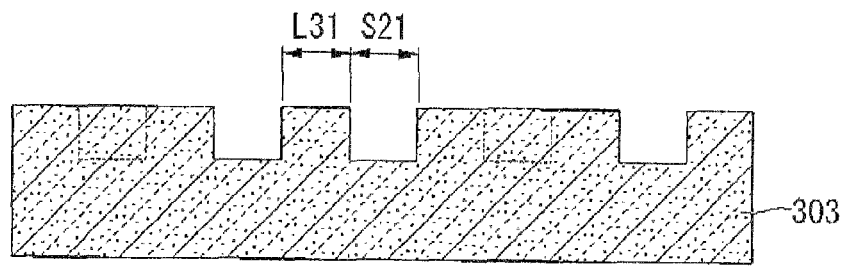
FIG. 33 is a schematic cross-sectional view showing the related method for forming the pair of trench patterns.

However, when the exposure conditions are adjusted so that the groove width (space width) S21 of the trench pattern 203a on the finally formed Si substrate 203b becomes identical to the groove width S11 in FIG. 24, the line width L21 between paired spaces becomes broader than the desired line width L31 between the paired spaces on the Si substrate 303 as illustrated in FIG. 33. This results from the asymmetric profile of the light intensify distribution of the light transmitted through the pattern described in FIG. 29B or 29C, but such an increase in the line width L21 results in a positional deviation of the pattern during the exposure due to the asymmetric profile. Moreover, such a positional deviation in the pattern may cause alignment errors with other layers such as a gate layer which is the upper layer, and thus affects the operation of a circuit.

For correction of the positional deviation, it is necessary to change the pattern of the reticle 201. However, not only because the correction of the pattern of the reticle 210 requires cost and time, but also because the amount of the positional deviation depends on the illumination conditions during the exposure and a targeting space dimension, it is necessary to perform simulation to estimate the amount of the positional deviation and compare the estimation results with the actual exposure results. Therefore, it is not easy to correct the positional deviation.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1A:
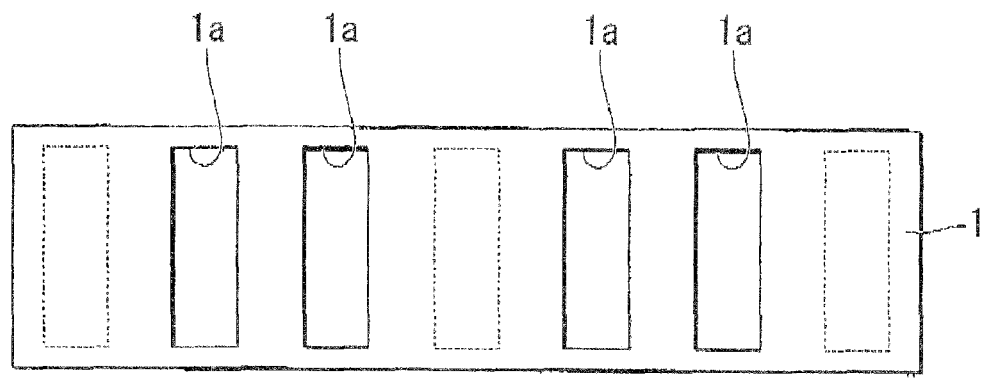
FIGS. 1A and 1B are a schematic top plan view and a cross-sectional view, respectively, illustrating the main parts of a semiconductor substrate which is fabricated by a manufacturing method of semiconductor device according to an embodiment of the invention.
Figure 1B:
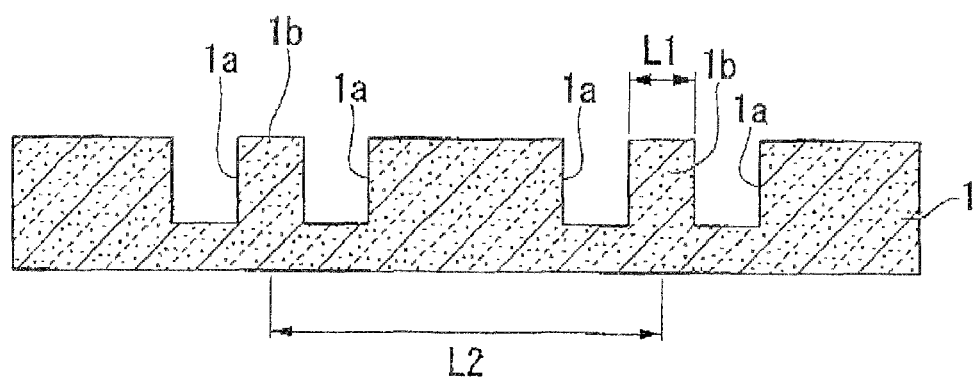

Hereinafter, the embodiments of the invention will be described with reference to the accompanying drawings. FIGS. 1A and 1B illustrate a partial enlarged view of a semiconductor substrate which can be obtained by a manufacturing method of semiconductor device according to the present invention. FIGS. 2 to 15 illustrate the process steps of the manufacturing method of semiconductor device according to the present embodiment.

FIG. 1A illustrates a semiconductor substrate 1 in which a pair of groove portions 1a is formed. FIG. 1A is a schematic top plan view. The semiconductor substrate 1 illustrated in FIG. 1A is fabricated by the manufacturing method of semiconductor device according to the present embodiment. FIG. 1B is a schematic cross-sectional view of the semiconductor substrate 1. In FIG. 1B, two sets of pairs of groove portions 1a are formed. A line pattern 1b is formed between the groove portions 1a.

On the inner surfaces of the pair of groove portions 1a, a gate insulating film formed of silicon oxide, for example, is formed, and a gate electrode is buried in the groove portions 1a so as to cover the gate insulating film. Moreover, on the semiconductor substrates on both sides of the gate electrode in the gate length direction, an impurity diffusion region serving as a source region and a drain region are formed. In this way, a trench-gate MOS transistor is formed on the semiconductor substrate 1 having the pair of groove portions 1a. Moreover, the pair of groove portions 1a is provided within one active region.

First Embodiment

Hereinafter, the manufacturing method of semiconductor device according to first embodiment will be described in detail.

Figure 2:
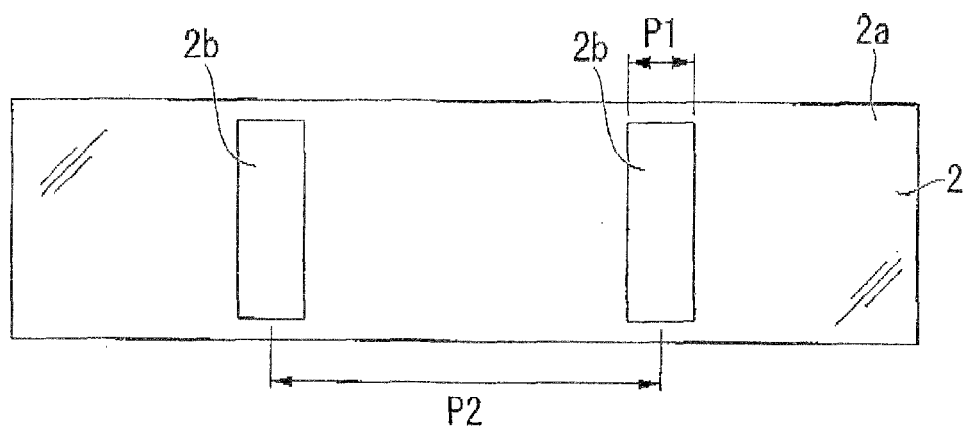
FIG. 2 is a schematic top plan view illustrating the main parts of a reticle which is used for the manufacturing method of semiconductor device according to the embodiment of the invention.

First, a reticle 2 as illustrated in FIG. 2 is prepared. The reticle 2 has such a configuration that a light shielding portion 2b composed of a mask pattern of Cr, for example, is formed on a transparent quartz substrate. The reticle 2 illustrated in FIG. 2 is configured such that a light transmitting portion 2a transmits exposure light therethrough and the light shielding portion 2b blocks exposure light. The width P1 of the light shielding portion 2b is designed to have a magnitude corresponding to the width L1 of the line pattern 1b illustrated in FIG. 1B. Moreover, the pitch P2 of the light shielding portion 2b is designed to have a magnitude corresponding to the pitch L2 of the line pattern 1b illustrated in FIG. 1B.

Figure 3:
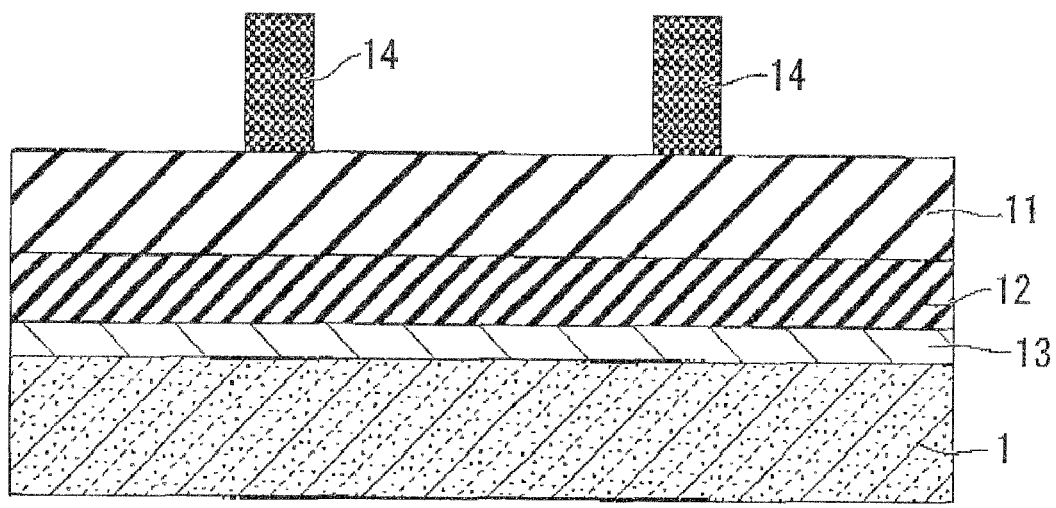
FIG. 3 is a schematic cross-sectional view showing the manufacturing method of semiconductor device according to the embodiment of the invention.

Next, as illustrated in FIG. 3, on the semiconductor substrate 1 (processed layer), a third mask layer 13, a second mask layer 12, and a first mask layer 11 are sequentially laminated. The mask layers 11, 12, and 13 are laminated on the entire surface of the processed layer 1. As the processed layer 1, a semiconductor substrate is used. Particularly, a semiconductor substrate having an element separation region and an active region is used. Moreover, an interlayer insulating layer, or the like, that constitutes a semiconductor device may be used as the processed layer 1.

The third mask layer 13 and the second mask layer 12 are preferably formed of materials, respectively, having different etching rates. Similarly, the second mask layer 12 and the first mask layer 11 are preferably formed of materials each having different etching rates. The third mask layer 13 and the first mask layer 11 may have different etching rates or may have the same etching rates. A silicon oxide layer can be used as the material of the third mask layer 13 and the first mask layer 11, and a silicon nitride layer can be used as the material of the second mask layer 12.

Next, after a positive photoresist film is laminated on the first mask layer 11, the photoresist film is exposed using the reticle 2 illustrated in FIG. 2, and a series of processes (photolithography) of development and dissolving is performed. In this way, a fourth mask layer 14 composed of a line pattern corresponding to the pattern of the light shielding portion 2b of the reticle 2 is formed.

Figure 4:
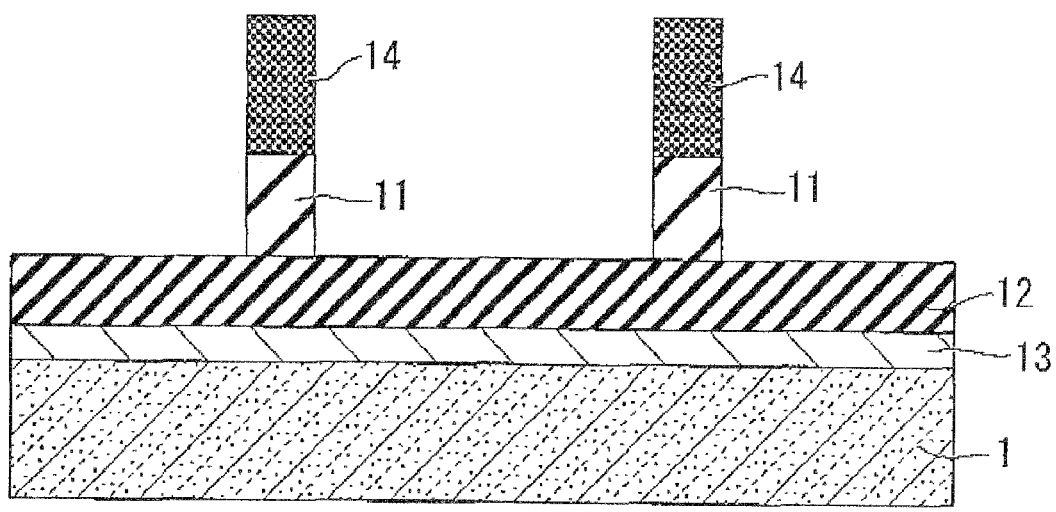
FIG. 4 is a schematic cross-sectional view showing the manufacturing method of semiconductor device according to the embodiment of the invention.
Figure 5:
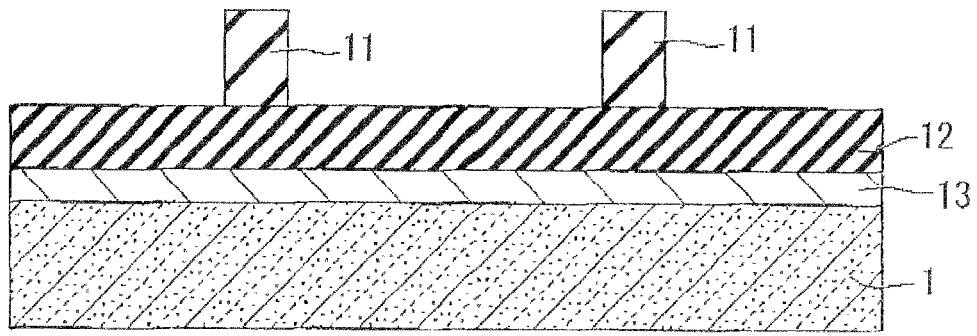
FIG. 5 is a schematic cross-sectional view showing the manufacturing method of semiconductor device according to the embodiment of the invention.

Next, as illustrated in FIG. 4, the first mask layer 11 is partially dry-etched using the fourth mask layer 14 as a mask. For example, the dry etching is performed under the condition that the first mask layer 11 (silicon oxide layer) is etched preferentially to the second mask layer 12 (silicon nitride film). Therefore, the dry etching of the first mask layer 11 stops at the point in time when it reaches the second mask layer 12. Thereafter, as illustrated in FIG. 5, the fourth mask layer 14 formed of the positive photoresist is removed by an ashing process. In this way, the first mask layer 11 is processed so as to have a line pattern form.

Figure 6:
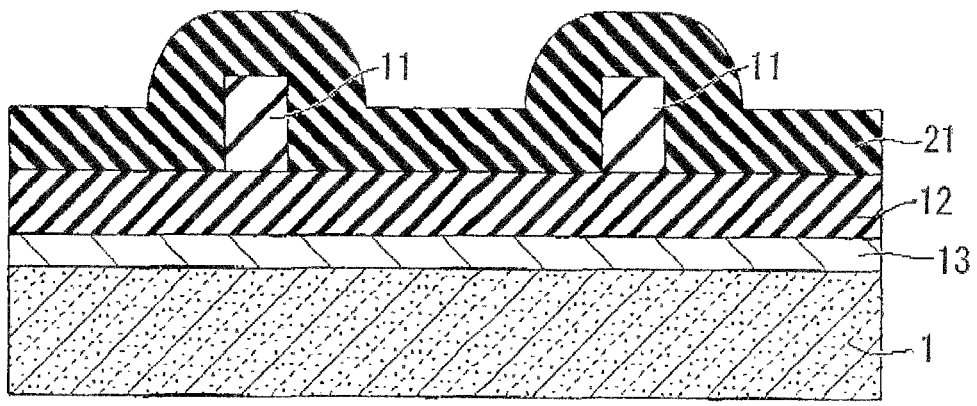
FIG. 6 is a schematic cross sectional view showing the manufacturing method of semiconductor device according to the embodiment of the invention.

Next, as illustrated in FIG. 6, a lamination film 21 is laminated so as to cover the first mask layer 11 and the second mask layer 12. As the material of the lamination film 21, a material having a different etching rate than the first mask layer 11 and the second mask layer is chosen. Specifically, the lamination film 21 is formed of, for example, a silicon film. The lamination film 21 is formed into a uniform thickness in conformity with the base consisting of the first mask layer 11 and the second mask layer 12 having the line pattern form. As a film-forming means of the lamination film 21, a CVD (chemical vapor deposition) method, for example, is used.

Figure 7:
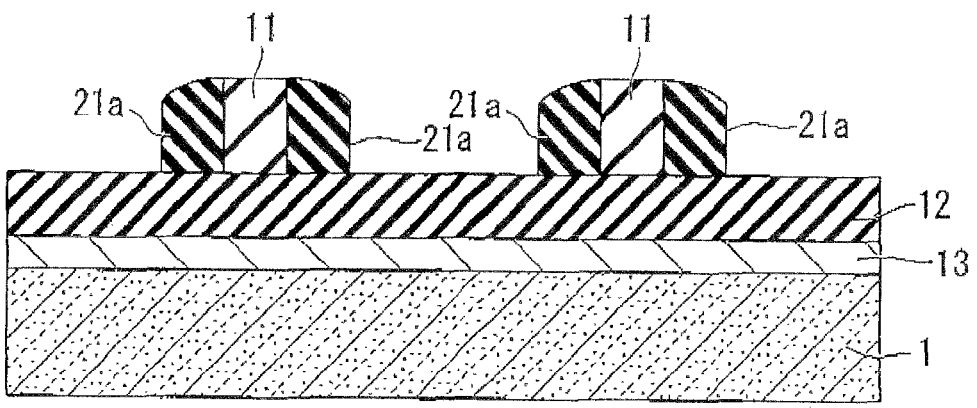
FIG. 7 is a schematic cross-sectional view showing the manufacturing method of semiconductor device according to the embodiment of the invention.

Next, as illustrated in FIG. 7, the entire surface of the lamination film 21 is subjected to anisotropic etching. The anisotropic etching is performed under the condition that the lamination film 21 (silicon film) is etched preferentially to the first mask layer 11 and the second mask layer 12. In this way, although only the lamination film 21 is subjected to the anisotropic etching, a portion thereof remains as a pair of sidewall layers 21a on both sides in the width direction of the first mask layer 11.

Figure 8:
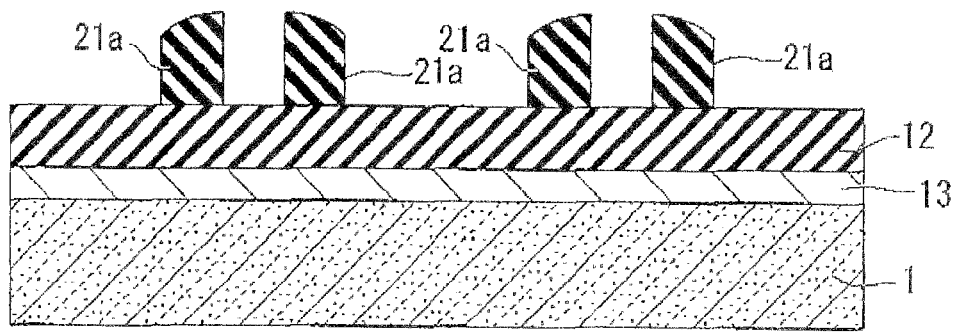
FIG. 8 is a schematic cross-sectional view showing the manufacturing method of semiconductor device according to the embodiment of the invention.

Next, as illustrated in FIG. 8, the first mask layer 11 is etched and removed. The etching is performed under the condition that the first mask layer 11 is etched preferentially to the second mask layer 12 and the sidewall layers 21a. In this way, only the first mask layer 11 is removed.

Figure 9:
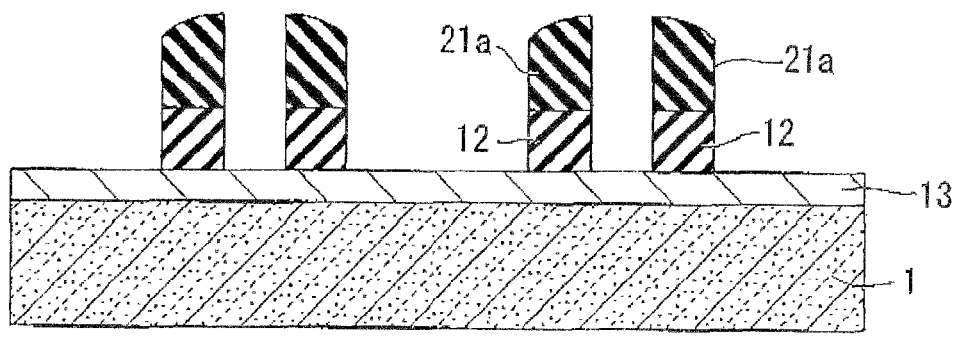
FIG. 9 is a schematic cross-sectional view showing the manufacturing method of semiconductor device according to the embodiment of the invention.

Next, as illustrated in FIG. 9, the second mask layer 12 is partially dry-etched using the pair of sidewall layers 21a as a mask. The dry etching is performed under the condition that the second mask layer 12 (silicon nitride) is etched preferentially to the sidewall layers 21a and the third mask layer 13. Therefore, the dry etching of the second mask layer 12 stops at the point in time when it reaches the third mask layer 13. In this way, the second mask layer 12 is processed so as to have a pair of line pattern forms corresponding to the pair of sidewall layers 21a.

Figure 10:
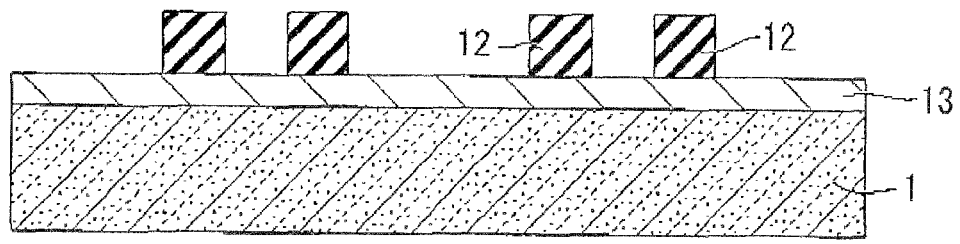
FIG. 10 is a schematic cross-sectional view showing the manufacturing method of semiconductor device according to the embodiment of the invention.

Next, as illustrated in FIG. 10, the sidewall layers 21a are etched and removed.

Figure 11:
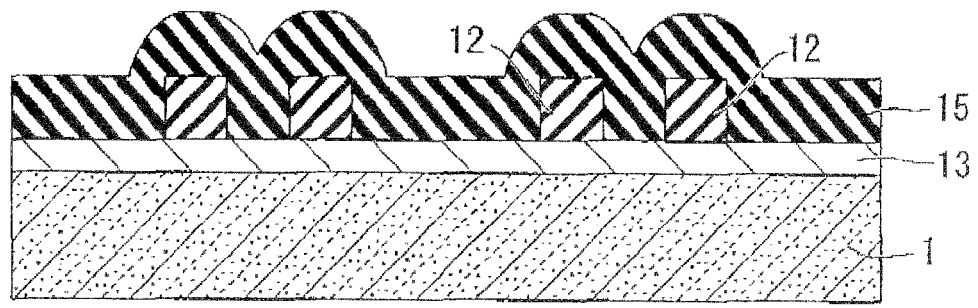
FIG. 11 is a schematic cross-sectional view showing the manufacturing method of semiconductor device according to the embodiment of the invention.

Next, as illustrated in FIG. 11, a fifth mask layer 15 is laminated so as to cover the second mask layer 12 processed to have a pair of line pattern forms and the third mask layer 13. As the material of the fifth mask layer 15, the same material as the processed layer 1, but having a different etching selectivity than the second mask layer 12, is chosen. Specifically, the fifth mask layer 15 is formed of, for example, polysilicon. The fifth mask layer 15 is formed into a uniform thickness in conformity with the base consisting of the second mask layer 12 and the third mask layer 13 having the line pattern form. As a film-forming means, a CVD (chemical vapor deposition) method, for example, is used.

Figure 12:
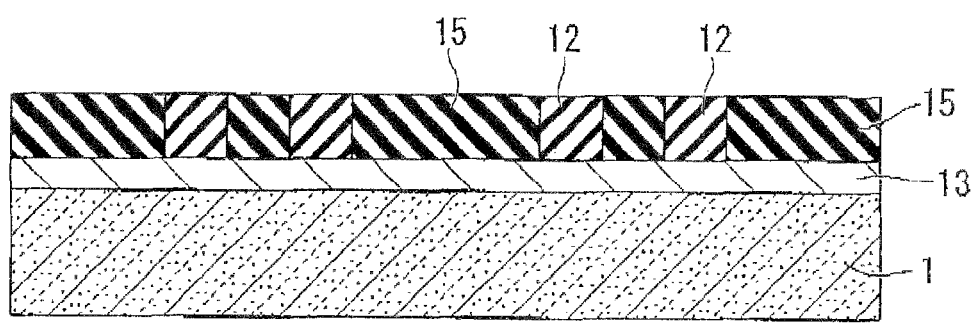
FIG. 12 is a schematic cross-sectional view showing the manufacturing method of semiconductor device according to the embodiment of the invention.

Next, as illustrated in FIG. 12, the upper surface of the fifth mask layer 15 is polished by CMP. The CMP-based polishing is performed until the upper surface of the second mask layer 12 is exposed. In this way, the second mask layer 12 processed to have a pair of line pattern forms and the fifth mask layer 15 are laminated on the third mask layer 13. The fifth mask layer 15 is formed at portions other than the portion on which the second mask layer 12 is formed. In other words, the fifth mask layer 15 is formed on the third mask layer 13 which is exposed due to the processing (patterning) of the second mask layer 12.

Figure 13:
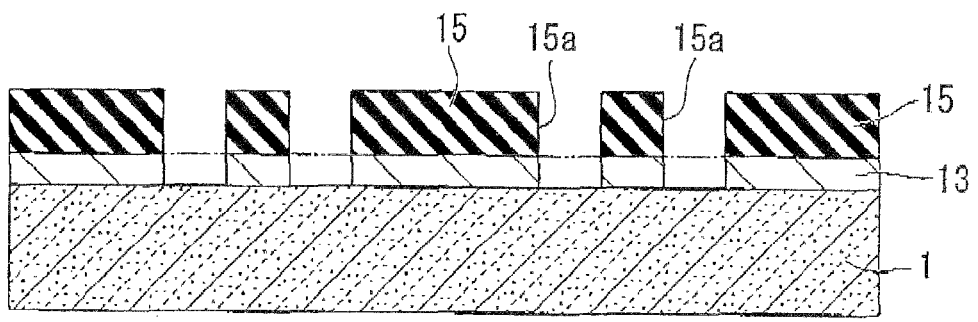
FIG. 13 is a schematic cross-sectional view showing the manufacturing method of semiconductor device according to the embodiment of the invention.

Next, as illustrated in FIG. 13, the second mask layer 12 is etched and removed. The etching is performed under the condition that the second mask layer 12 (silicon nitride) is etched preferentially to the fifth mask layer 15 (polysilicon) and the third mask layer 13 (silicon oxide). In this way, only the second mask layer 12 is etched. As a result of the removal of the second mask layer 12, an opening portion 15a is substantially formed in the fifth mask layer 15, so that a portion of the third mask layer 13 is exposed through the opening portion 15a.

Subsequently, the third mask layer 13 is partially dry-etched using the fifth mask layer 15 as a mask. The dry etching is performed under the condition that the third mask layer 13 (silicon oxide) is etched preferentially to the processed layer 1 (the semiconductor substrate formed of silicon), for example. In this way, the opening portion 15a penetrates through the third mask layer 13. The etching stops at the point in time when the opening portion 15a reaches the processed layer 1. In this manner, by partially etching the third mask layer 13 using the fifth mask layer 15 as the mask, a pair of opening portions 15a corresponding to the pair of line patterns of the second mask layer 12 is formed in the third mask layer 13.

Figure 14:
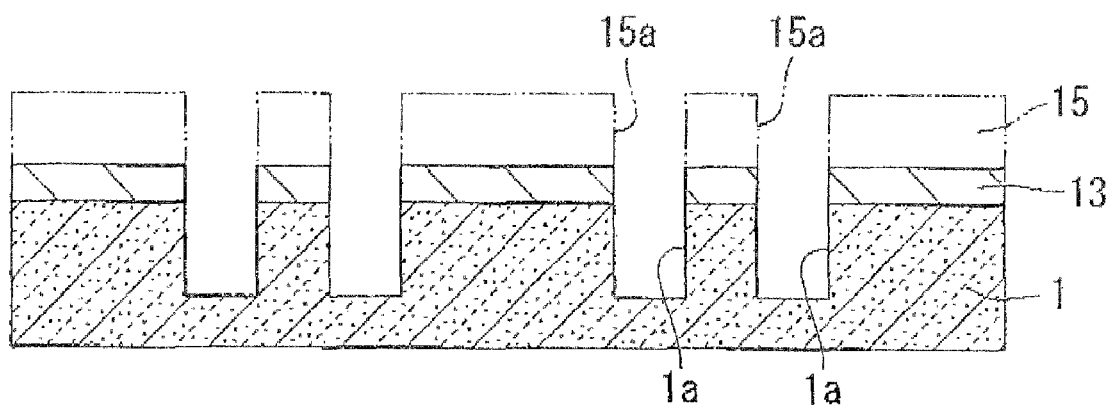
FIG. 14 is a schematic cross-sectional view showing the manufacturing method of semiconductor device according to the embodiment of the invention.

Next, as illustrated in FIG. 14, the processed layer 1 is partially etched using the fifth mask layer 15 having the pair of opening portions 15a formed therein and the third mask layer 13 as a mask, whereby a pair of groove portions 1a is formed in the processed layer 1. Since the processed layer 1 and the fifth mask layer 15 are formed of the same materials, the fifth mask layer 15 is etched and removed simultaneously with the etching of the processed layer 1. Eventually, the remaining third mask layer 13 functions as an etching mask of the processed layer 1.

Figure 15:
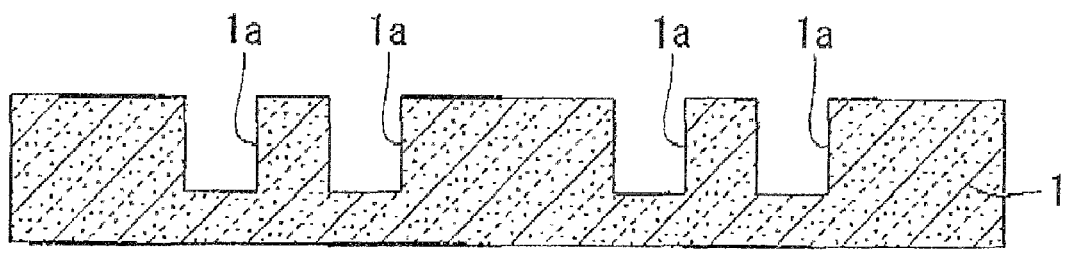
FIG. 15 is a schematic cross-sectional view showing the manufacturing method of semiconductor device according to the embodiment of the invention.

Finally, as illustrated in FIG. 15, the third mask layer 13 is etched and removed. In this way, the pair of groove portions 1a is formed in the processed layer 1.

In the above-described manufacturing method of semiconductor device, the pair of sidewall layers 21a are formed at positions corresponding to both sides in the width direction of the line pattern of the fourth mask layer 14, the opening portions 15a are formed at positions corresponding to the pair of sidewall layers 21a, and the processed layer 1 exposed through the opening portions 15a is etched, whereby the pair of groove portions 1a are formed in the processed layer 1. Due to such a configuration, the line pattern of the fourth mask layer 14 will eventually correspond to the line pattern 1b between the pair of groove portions 1a. Therefore, according to the above-described manufacturing method of semiconductor device, it is only necessary to form the fourth mask layer 14 corresponding to the line pattern 1b between the pair of groove portions 1a, but it is not necessary to form a mask layer having a shape corresponding to the groove portions 1a by photolithography as in the related case. Accordingly, it is possible to increase the spacing between the light shielding portions 2b of the reticle 2 when the fourth mask layer 14 is processed using the reticle 2 by photolithography, the effect of the asymmetric profile of the light intensity distribution of the transmitted light is reduced, and the L/S pattern can be formed as designed.

Moreover, in the above-described manufacturing method of semiconductor device, the shape of the sidewall layers 21a is eventually reflected on the shape of the pair of groove portions 1a which are formed in the processed layer 1. The pair of sidewall layers 21a is formed by laminating the lamination film 21 so as to cover the first mask layer 11 and the second mask layer 12 and then subjecting the entire surface of the lamination film 21 to anisotropic etching. The pair of sidewall layers 21a formed through such processes is formed into substantially the same shape. Therefore, in the above-described manufacturing method of semiconductor device, by forming the sidewall layers 21a through the described processes, it is possible to form the pair of groove portions 1a having substantially the same shape.

Furthermore, in the above-described manufacturing method of semiconductor device, after the fifth mask layer 15 is formed so as to cover the second mask layer 12 processed to have a pair of line pattern forms and to cover the third mask layer 13, the fifth mask layer 15 is polished to expose the second mask layer 12. In this way, the second mask layer 12 having the pair of line pattern forms and the fifth mask layer 15 are laminated on the third mask layer 13. Thereafter, by removing the second mask layer 12, the opening portions 15a are formed in the third mask layer 13 and the fifth mask layer 15. By performing such processes, the opening portions 15a corresponding to the sidewall layers 21a can be easily formed.

Furthermore, in the above-described manufacturing method of semiconductor device, since the fifth mask layer 15 and the processed layer 1 are formed of the same materials and the fifth mask layer 15 is etched and removed simultaneously with the partial etching of the processed layer 1, it is not necessary to perform an additional step for removing the fifth mask layer 15, and thus, the number of necessary process steps can be reduced.

Second Embodiment

Figure 16A:
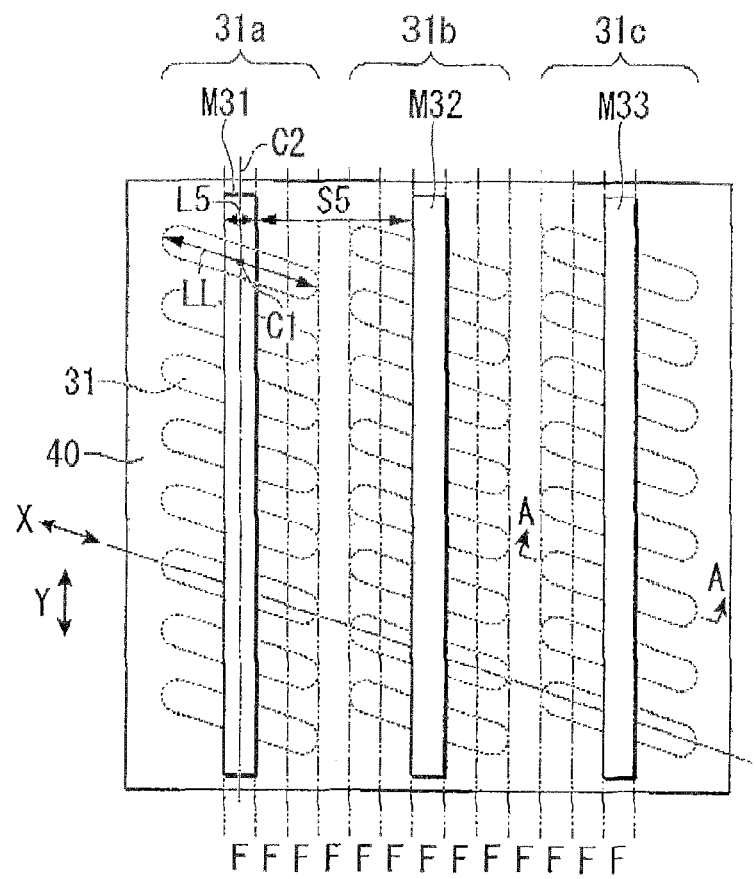
FIG. 16A, and FIGS. 16B and 16C are a top plan view and schematic cross-sectional views, respectively, showing the manufacturing method of semiconductor device according to the embodiment of the invention.

In second embodiment, a method for forming a DRAM memory cell having a trench-gate MOS transistor using the sidewall DPT will be described with reference to FIGS. 16 to 19. FIGS. 16A, 18D, and 19B are top plan views of a portion of the memory cell. FIGS. 18C and 19A are cross-sectional views of the B-B section illustrated in the top plan view of FIG. 18D. Other figures are cross-sectional views of the A-A section illustrated in the top plan view of FIG. 16A.

This embodiment will be described for the case where the trench width is 40 nm, which is the minimum processing dimension (F value), determined by the resolution limit of lithography.

First, as illustrated in the top plan view of FIG. 16A, a plurality of active regions 31 which is surrounded by an element separation region 40 formed of silicon oxide and arranged regularly is formed on a semiconductor substrate 1 formed of, for example, silicon. Specifically, the memory cell of this embodiment has such a configuration in which a plurality of elliptical active regions 31 surrounded by the element separation region 40 is repeatedly arranged at equal intervals in a first direction (X direction), which is the extending direction of the longer diameter LL of the ellipse, and a second direction (Y direction) intersecting the first direction. More specifically, an active region group (31a, 31b, or 31c), in which the plurality of active regions 31 is repeatedly arranged at equal intervals in the second direction (Y direction), is repeatedly arranged at equal intervals in the first direction (X direction). That is to say, the memory cell includes a plurality of active region groups (31a, 31b, and 31c) which are repeatedly arranged at equal intervals in the first direction (X direction). The spacing of the respective active region groups (31a, 31b, and 31c) in the first direction (X direction) is designed to be identical to the F value.

Each of the respective active regions 31 is provided with a first diffusion layer region, a first gate electrode region, a second diffusion layer region, a second gate electrode region, and a third diffusion layer region, which extend in the direction of the longer diameter LL. That is to say, the second diffusion layer region is positioned at the center of the active region, the first gate electrode region and the first diffusion layer region are sequentially arranged in this order on the left side of the second diffusion layer region, and the second gate electrode region and the third diffusion layer region are sequentially arranged in this order on the right side of the second diffusion layer region. The width of each of the first diffusion layer region, the first gate electrode region, the second diffusion layer region, the second gate electrode region, and the third diffusion layer region, which extend in the direction of the longer diameter LL, is designed to be identical to the F value.

Figure 16B:
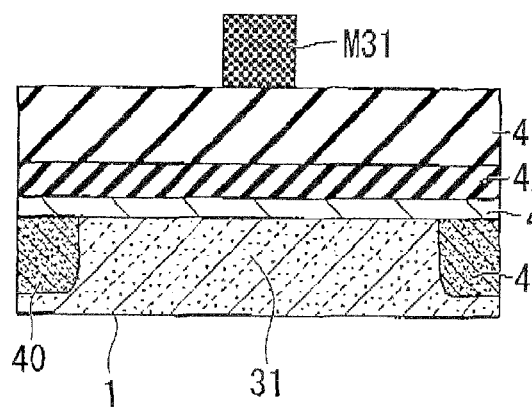

Thereafter, as illustrated in FIG. 16B, a third mask layer 43 formed of, for example, silicon oxide, a second mask layer 42 formed of, for example, silicon nitride, and a first mask layer 41 formed of, for example, silicon oxide, are sequentially formed on the entire surface. Here, the thickness of the first mask layer 41 needs to be larger than the width of a trench (T3) which will be formed in the semiconductor substrate in a later step. The thickness is preferably smaller than two times the width because the excessively thick first mask layer 41 may result in a deterioration of processing accuracy. The thickness is more preferably smaller than 1.5 times the width.

Next, a fourth mask layer M31 which serves as a first pattern and is composed of a photoresist is formed by the lithography method described in the first embodiment. In the memory cell region illustrated in FIG. 16A, first patterns (M31, M32, or M33) are formed in which a plurality of line patterns are arranged for each of the respective active regions 31 extending in the first direction (X direction), where the central line of each line pattern corresponds to a straight line C2 that connects the centers C1 of the longer diameters LL of the respective active regions 31 arranged repeatedly in the second direction (Y direction).

Moreover, the width of the fourth mask layer M31, namely the width of the line L5 is identical to the F value and is formed so as to be identical to the 40 nm width of the trench T3 which will be eventually formed. The spacing S5 between the adjacent patterns M31 and M32 is designed to be 5F which is five times the width L5 of the pattern M31. That is to say, the first patterns (M31, M32, and M33) constitute an evenly arranged L/S pattern in which the pitch thereof (L5+S5) is designed to be 6F, which is six times the line L5.

Figure 16C:
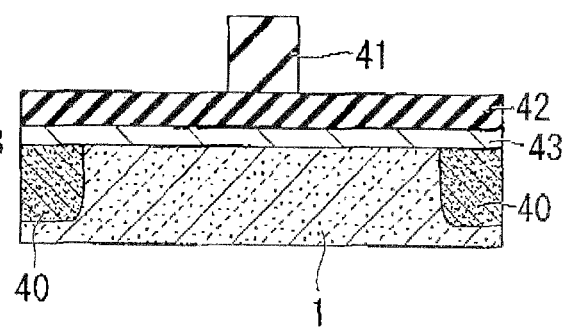

Next, as illustrated in FIG. 16C, the first mask layer 41 is subjected to anisotropic dry etching using the fourth mask layer M31 as a mask to transfer the first pattern onto the first mask layer 41. Thereafter, the fourth mask layer M31 is removed by plasma ashing.

Figure 17A:
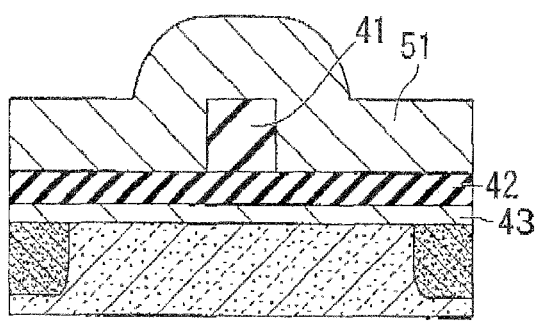
FIGS. 17A to 17H are a series of schematic cross-sectional views showing the manufacturing method of semiconductor device according to the embodiment of the invention.

Next, as illustrated in FIG. 17A, a silicon film 51 is formed on the entire surface. The silicon film 51 is formed to have the same width, namely 40 nm, as the width (T3) of a trench which will be formed later. The silicon film 51 may be a polysilicon film (polycrystalline silicon film) but is preferably an amorphous silicon film having no crystal grain boundary that affects the processing accuracy. The amorphous silicon film can be formed by maintaining the film-forming temperature at 500 to 540° C. using a thermal CVD method that uses monosilane ($SiH_4$) as a raw material gas.

Figure 17B:
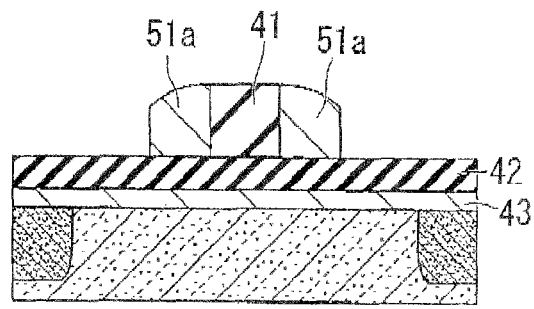

Next, as illustrated in FIG. 17B, the silicon film 51 is etched back by a dry-etching method to form sidewalls 51a on the side walls of the first mask layer 41. Since the silicon film 51 is formed to have a film thickness of 40 nm, the sidewalls 51a also have a maximum width of 40 nm.

Figure 17C:
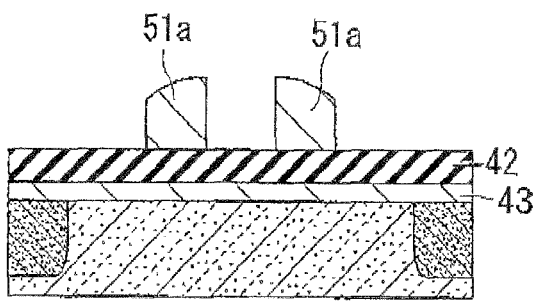

Next, as illustrated in FIG. 17C, the first mask layer 41 is selectively etched by using a solution containing a hydrofluoric acid (HF). In this way, a second pattern formed of the silicon film 51a is formed. The second pattern corresponds to the position of the trench (T3) which will be formed later.

Figure 17D:
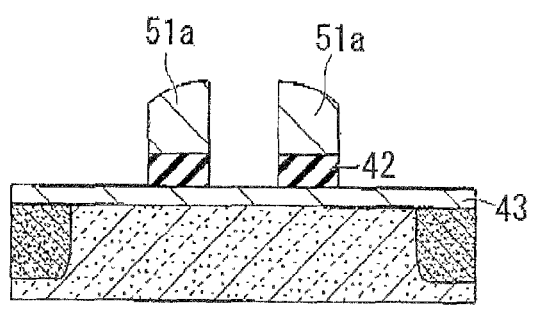

Next, as illustrated in FIG. 17D, the second mask layer 42 formed of a silicon nitride film is subjected to anisotropic dry etching using the silicon film 51a as a mask.

Figure 17E:
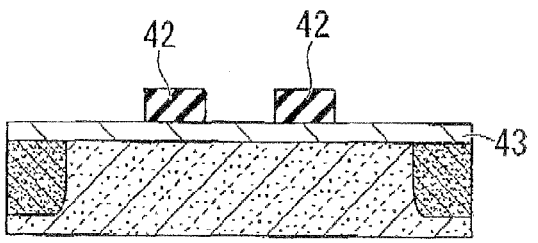

Next, as illustrated in FIG. 17E, the silicon film 51a used as the mask is selectively removed. For the selective removal of the silicon film 51a, isotropic plasma etching, or the like, that uses a chlorine-containing gas may be used. In this way, the second pattern formed on the silicon film 51a is transferred onto the second mask layer 42.

Figure 17F:
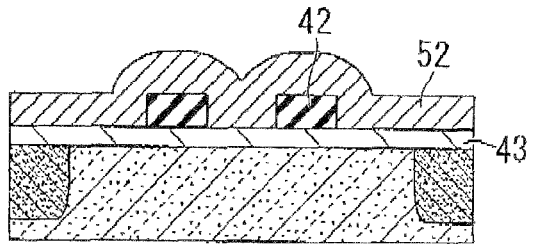

Next, as illustrated in FIG. 17F, a silicon film 52 is formed on the entire surface. Similar to the above-described silicon film 51a, the silicon film 52 may be formed of polysilicon, but is preferably formed of amorphous silicon.

Figure 17G:
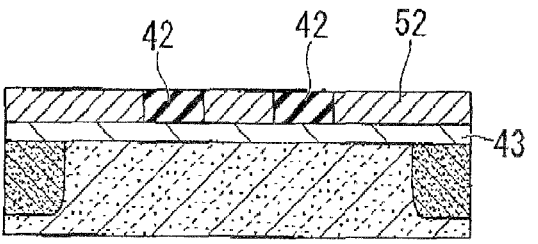

Next, as illustrated in FIG. 17G, the silicon film 52 which is formed into a convex shape on the second mask layer 42 is polished by a CMP method to expose the top surface of the second mask layer 42.

Figure 17H:
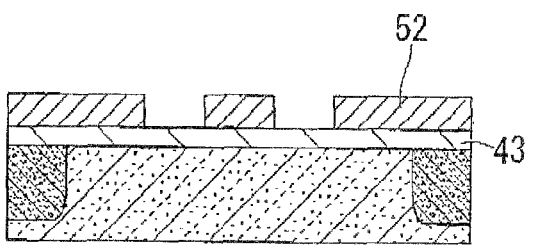

Next, as illustrated in FIG. 17H, the second mask layer 42 is selectively removed using a hot phosphoric acid. In this way, the second pattern composed of the line pattern formed of the second mask layer 42 is transformed into a groove pattern which is formed within the silicon film 52 and has a width of 40 nm. The third mask layer 43 formed of a silicon oxide film is exposed to the bottom portion of the groove pattern.

Figure 18A:
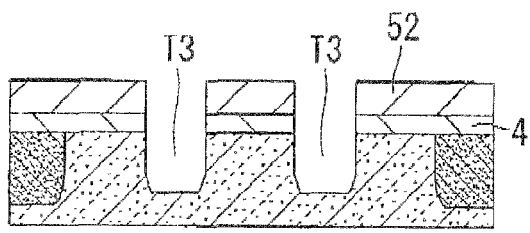
FIGS. 18A to 18C and FIG. 18D are schematic cross-sectional views and a top plan view, respectively, showing the manufacturing method of semiconductor device according to the embodiment of the invention.
Figure 19A:
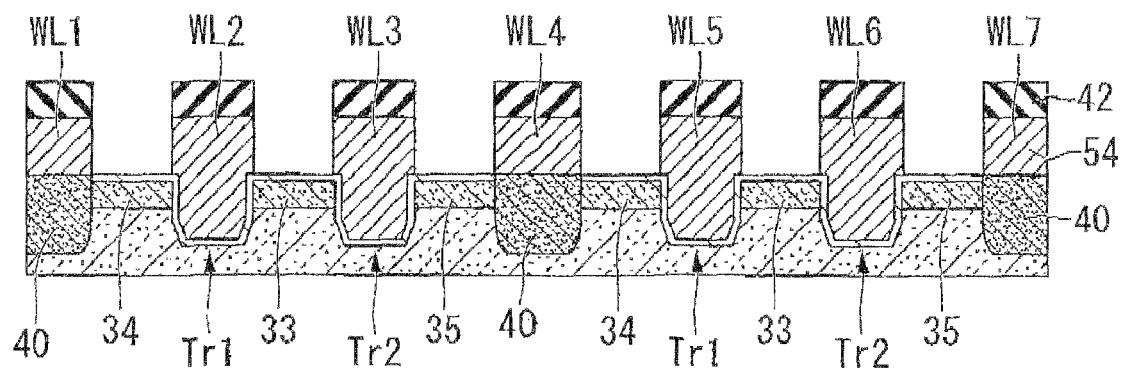
FIGS. 19A and 19B are a schematic cross-sectional view and a top plan view, respectively, showing the manufacturing method of semiconductor device according to the embodiment of the invention.
Figure 19B:
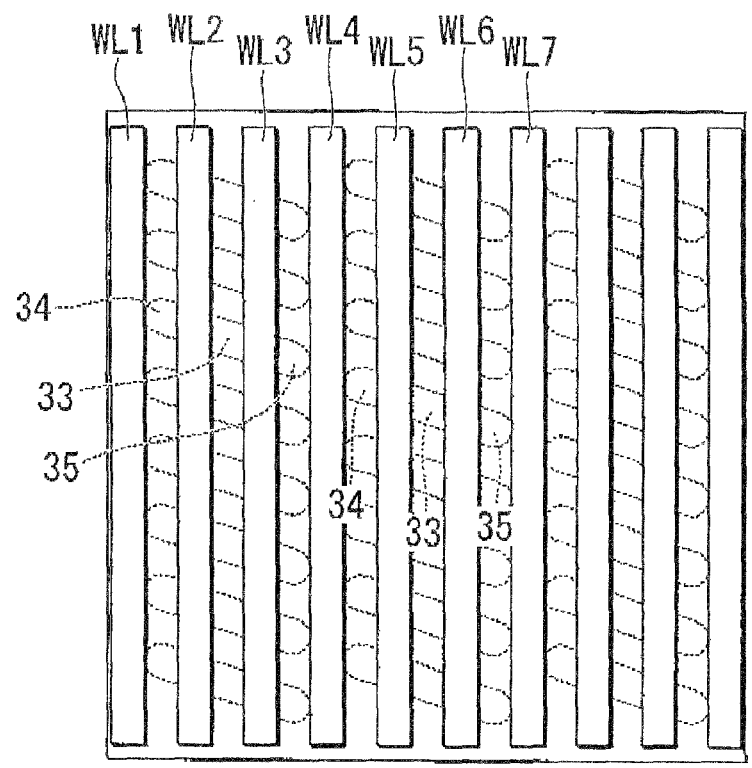

Next, as illustrated in FIG. 18A, using the silicon film 52 as a mask, the third mask layer 43 exposed to the bottom portion of the groove pattern is removed by an anisotropic dry etching that uses fluorine-containing plasma. Subsequently, the silicon of the substrate exposed to the bottom of the third mask layer is subjected to anisotropic dry etching by changing the etching gas of the same chamber to a chlorine-containing gas, whereby two trenches (T3) having a width of 40 nm are formed within one active region. At this time, since the groove pattern does not exist on the element separation region, the trench is not formed therein. Here, it should be noted that the anisotropic dry etching of the silicon of the substrate may be carried out in a different chamber. Since the silicon film 52 used as the mask is also etched simultaneously with the forming of trenches (T3) in the silicon substrate, it is not necessary to perform an additional step for removing the silicon film 52. After the trenches (T3) are formed, the third mask layer 43 is removed by using a solution containing a hydrofluoric acid to expose the top surface of the silicon substrate within the active region 31.

Figure 18B:
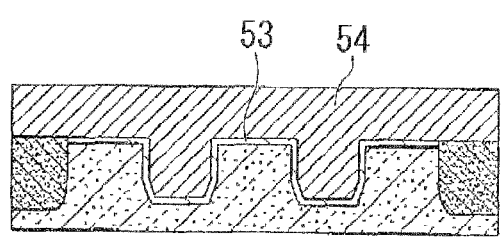
Figure 18C:
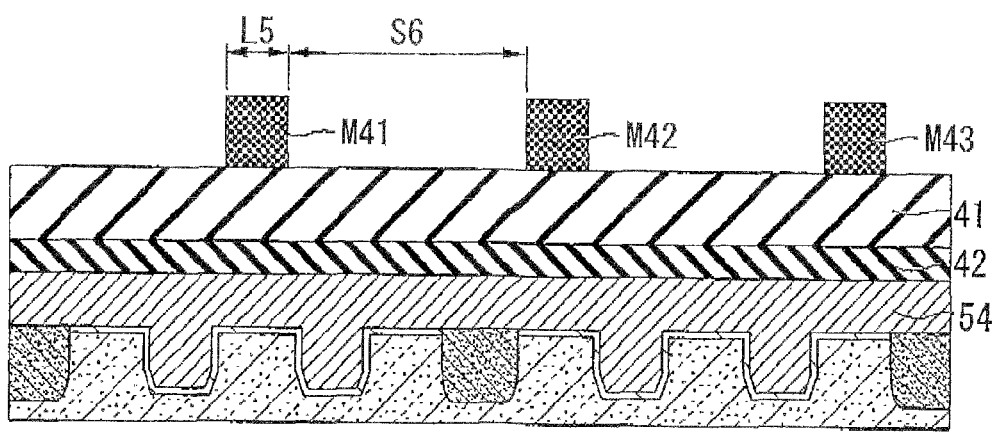
Figure 18D:
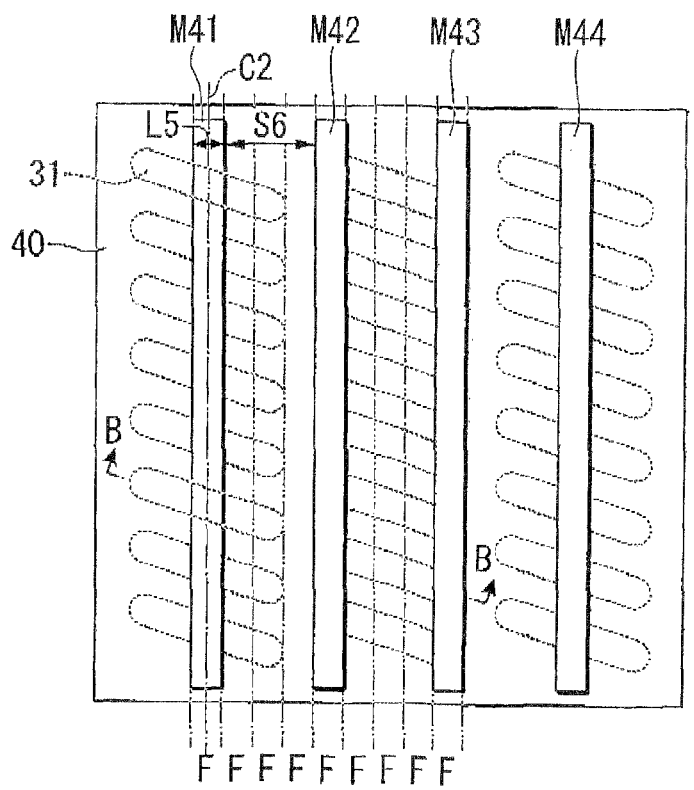

Next, as illustrated in FIG. 18B, a gate insulating film 53 is formed on the inner portions of the trenches (T3) and the top surface of the exposed silicon substrate, and a gate electrode material 54 is subsequently formed so that the trenches (T3) are completely buried. Hereinafter, although gate electrodes, namely word lines, may be formed using the related method described with reference to FIGS. 26A to 26C or 27A to 27D, in this embodiment, the word lines are formed using the sidewall DPT.

As illustrated in FIG. 18B, after the gate electrode material 54 is formed on the entire surface, the second mask layer 42 and the first mask layer 41 are formed again as illustrated in FIG. 16B. Here, the third mask layer 43 is not necessary because it is only necessary to form a line pattern. Moreover, as illustrated in FIG. 18C, by a lithography process, a fourth mask layer M41, M42, and M43 is formed which serves as the first pattern and is formed of a photoresist. FIG. 18C is a cross-sectional view of the B-B section illustrated in the top plan view of FIG. 18D. Referring to FIG. 18D, the fourth mask layer M41 serving as the first pattern is configured by a line pattern which has a width identical to the F value and has such a configuration, similar to the pattern M31 illustrated in FIG. 16A, so that the central line of the line pattern corresponds to the straight line C2 that connects the centers of the longer diameters of the respective active regions 31 arranged repeatedly in the second direction (Y direction), and the fourth mask layer M41 is arranged so as to intersect the centers of the plurality of active regions 31 in the Y direction. That is to say, the fourth mask layer M41 is arranged at positions overlapping the drain diffusion layer 33 illustrated in FIG. 27. Moreover, the adjacent fourth mask layer M42 is formed at a position separated by a spacing of S6 (3F) from the mask layer M41 in FIG. 18D. That is to say, the adjacent fourth mask layer M42 is arranged at a position where it intersects the source diffusion layer 34 positioned at the left end of the central active region group in the Y direction. Furthermore, the fourth mask layer M43 is formed at a position separated by a spacing of S6 (3F) from the mask layer M42 in FIG. 18D. That is to say, the fourth mask layer M43 is arranged at a position where it intersects the source diffusion layer 35 positioned at the right end of the central active region group in the Y direction. Although not illustrated in FIG. 18C, similar to the positional relationship of the mask layer M41, the fourth mask layer M44 is arranged at a position where it vertically intersects the center of the right-side active region group in FIG. 18D, namely the drain diffusion layer 33. That is to say, the first patterns M41, M42, M43, and M44 constitute an L/S pattern in which the width of each line L5 is identical to the F value, namely 40 nm, and the pitch (L5+S6) is identical to 4F which is four times the line L5.

After the structure illustrated in FIG. 18C is formed, the second pattern 42 is formed through the processes of FIGS. 16C to 17E, and the gate electrode material 54 is subjected to anisotropic dry etching using the second pattern 42 as a mask, whereby the word lines WL1 to WL7, serving as the gate electrodes, are formed as illustrated in FIG. 19A. From the first pattern M41, two second patterns 42 are formed on both sides thereof, and the word lines WL2 and WL3 are formed so as to correspond to the second patterns 42. Similarly, the word lines WL4 and WL5 are formed from the first pattern M42, and the word lines WL6 and WL7 are formed from the first pattern M43. The second pattern 42 which is used as a mask for processing the gate electrode material 54, namely the second mask layer 42 formed of a silicon nitride film, can be left as a protection film of the gate electrodes without being removed after the gate electrodes are formed.

After the respective word lines are formed, ion implantation and heat treatment are performed using the second mask layer 42 as a mask to form the drain diffusion layer 33, and the source diffusion layers 34 and 35. In this way, it is possible to form two trench-gate MOS transistors Tr1 and Tr2 that share the drain diffusion layer 33 in each of the active regions. Thereafter, by performing processes such as formation of sidewalls of the gate electrodes, formation of an interlayer insulating film, formation of cell contact plugs, formation of bit-line contact plugs and bit-lines, and formation of capacitive contact plugs and capacitive elements, the DRAM memory cell regions can be formed.

The memory cell region according to the present embodiment has such a configuration in which a plurality of elliptical active regions surrounded by the element separation region is repeatedly arranged at equal intervals in the first direction (X direction) along which the longer diameter of the ellipse extends and the second direction (Y direction) intersects the first direction. The first patterns are formed in which a plurality of line patterns are arranged for each of the respective active regions extending in the first direction, where the central line of each line pattern corresponds to the straight line that connects the centers of the longer diameters of the respective active regions arranged in the second direction. From the respective line patterns, the second pattern which is composed of two groove patterns which are positioned on both sides of each line pattern is formed. Thereafter, the trenches corresponding to the second pattern are formed in one active region. Therefore, trenches can be formed in only the active region while preventing trenches from being formed in the element separation region.

Moreover, the first patterns constitute an L/S pattern which is evenly arranged at a pitch that is six times the width of one line pattern. Therefore, it is possible to form the first patterns formed of a photoresist during the lithographic exposure without causing deterioration in the optical characteristics.

Furthermore, since the second pattern is formed by using the sidewalls formed of a silicon film which is formed by the CVD method, it is possible to control the width of the second pattern by controlling the film thickness of the silicon film and thus to enable patterns to be formed with high precision.

In the present embodiment, the sidewall DPT is used not only for formation of the trenches but also for processing of the gate electrodes serving as the word lines. In this case, since the first patterns can be formed by the evenly arranged L/S pattern in which the pitch of the line pattern is four times the width of the line, it is possible to form the first patterns from the photoresist without causing deterioration in the optical characteristics during the lithographic exposure, and thus to enable the patterns to be formed with high precision.

According to the manufacturing method of semiconductor device of the invention, there is no fear of occurrence of the positional deviation of the pattern during the extension portion due to the asymmetric profile, and the circuit pattern can be formed as designed. Moreover, since the trenches are not formed in the element separation region, it is possible to avoid such a problem that the parasitic capacitance of the word lines increases; thus making semiconductor devices unable to perform high-speed operations or making voltage withstand failures likely to occur in the gate insulating film, so that sources of adjacent active regions are short-circuited via word lines, resulting in malfunction. As a result, it is possible to make sure that trench-gate MOS transistors are formed in only the active regions.

It is apparent that the present invention is not limited to the above embodiments, but may be modified and changed without departing from the scope and spirit of the invention.

What is claimed is:

1. A manufacturing method of semiconductor device comprising:
   sequentially laminating a third mask layer, a second mask layer, and a first mask layer on a processed layer;
   forming a fourth mask layer comprising a line pattern on the first mask layer by photolithography that uses a reticle;
   processing the first mask layer so as to have a line pattern form corresponding to the line pattern of the fourth mask layer by partially etching the first mask layer using the fourth mask layer as a mask;
   forming a pair of sidewall layers on both sides in the line-width direction of the first mask layer and subsequently etching and removing the first mask layer;
   processing the second mask layer so as to have a pair of line pattern forms corresponding to the pair of sidewall layers by partially etching the second mask layer using the pair of sidewall layers as a mask;
   forming a fifth mask layer having a different etching selectivity from that of the second mask layer, on the third mask layer which is exposed due to the processing of the second mask layer;
   forming a pair of opening portions which correspond to the pair of line patterns of the second mask layer, in the third mask layer by etching and removing the second mask layer and subsequently partially etching the third mask layer using the fifth mask layer as a mask; and
   forming a pair of groove portions on the processed layer by partially etching the processed layer using the third mask layer in which the pair of opening portions are formed as a mask.

2. The manufacturing method of semiconductor device according to claim 1 further comprising:
   forming the pair of sidewall layers composed of a part of the lamination film on both sides of the line-width direction of the first mask layer, by laminating a lamination film so as to cover the first mask layer and the second mask layer and subjecting the surface of the lamination film to anisotropic etching, after processing the first mask layer to have the line pattern form.

3. The manufacturing method of semiconductor device according to claim 2, wherein a material of the lamination film is a polysilicon.

4. The manufacturing method of semiconductor device according to claim 1, wherein the forming the fifth mask layer forms the fifth mask layer so as to cover the second mask layer and the third mask layer, and polishes an upper surface of the fifth mask layer to expose the second mask layer.

5. The manufacturing method of semiconductor device according to claim 1, wherein the fifth mask layer is made of the same material as the processed layer, and the partial etching of the processed layer is performed with the etching of the fifth mask layer.

6. The manufacturing method of semiconductor device according to claim 1, wherein a semiconductor substrate is used as the processed layer.

7. The manufacturing method of semiconductor device according to claim 1, further comprising:
   forming a trench-gate transistor by forming a gate insulating film on an inner surface of the pair of groove portions formed in the semiconductor substrate and burying a gate electrode in the groove portions, using a semiconductor substrate as the processed layer.

8. The manufacturing method of semiconductor device according to claim 7, wherein the pair of groove portions are formed within an active region formed in the semiconductor substrate.

9. The manufacturing method of semiconductor device according to claim 1, wherein a material of each of the first and third mask layers is a silicon oxide.

10. The manufacturing method of semiconductor device according to claim 1, wherein a material of the second mask layer is a silicon nitride.

11. A manufacturing method of semiconductor device comprising:
    forming at least one active region group on a semiconductor substrate, the active region group comprising a plurality of elliptical active regions surrounded by an element separation region, where a first direction is defined along the direction of the longer diameter of the elliptical active regions, and the plurality of active regions are arranged at equal intervals in a second direction intersecting the first direction;
    forming a mask layer on a surface of the semiconductor substrate;
    forming at least one first pattern having a line form on the mask layer so as to extend over the plurality of active regions constituting the active region group;
    processing the mask layer using the first pattern as a base to form a plurality of second patterns at positions on both sides of and in contact with the first pattern;
    forming a plurality of trenches on the semiconductor substrate within the active regions using the second patterns as a mask; and
    forming a gate electrode in the trenches to form a plurality of trench-gate MOS transistors in the active regions constituting the active region group,
    wherein the step of processing the mask layer comprises:
    sequentially laminating a third mask layer, a second mask layer, and a first mask layer on the substrate;
    forming a fourth mask layer composed of the first pattern having a line form extending over the plurality of active regions and extending in the second direction so as to cover a plurality of the second diffusion layer regions of the active regions arranged in the second direction, on the first mask layer;

etching the first mask layer using the fourth mask layer as a mask to form the first pattern on the first mask layer;

removing the fourth mask layer used as the mask;

forming a sidewall layer on the second mask layer;

forming sidewalls by an etch-back, on both side walls of the first mask layer having the first pattern formed thereon and simultaneously exposing the upper surface of the first mask layer;

selectively removing the first mask layer, of which the upper surface is exposed, to form a pair of the second patterns which are composed of the sidewalls and correspond to the gate electrode;

etching the second mask layer using the pair of second patterns composed of the sidewalls as a mask to form the second patterns on the second mask layer;

removing the sidewalls used as the mask;

forming a fifth mask layer on the first mask layer and the second mask layer and removing the fifth mask layer formed on the second mask layer to expose the upper surface of the second mask layer; and selectively removing the second mask layer, of which the upper surface is exposed, to form the plurality of second patterns having a groove form in the fifth mask layer.

12. The manufacturing method of semiconductor device according to claim 11, wherein the forming at least one first pattern forms one first pattern having a line form on the mask layer, the processing the mask layer processes the mask layer to form two of the second patterns, the forming a plurality of trenches forms two trenches on the semiconductor substrate, and the forming a gate electrode forms two trench-gate MOS transistors.

13. The manufacturing method of semiconductor device according to claim 12, wherein each of the active regions is provided with a first diffusion layer region, a first gate electrode region, a second diffusion layer region, a second gate electrode region, and a third diffusion layer region, which are located in the direction of the longer diameter of each of the active regions, and the forming at least one first pattern forms the one first pattern having a line form extending over the plurality of active regions, at a position corresponding to the second diffusion layer region.

14. The manufacturing method of semiconductor device according to claim 11, wherein the forming at least one first pattern forms the first pattern on a straight line that connects the centers of the longer diameters of the plurality of active regions together.

15. The manufacturing method of semiconductor device according to claim 11, wherein a plurality of the active region groups are arranged along the first direction, and the forming at least one first pattern forms the first pattern on a straight line that connects the centers of the longer diameters together, in each of the plurality of the active region groups.

16. The manufacturing method of semiconductor device according to claim 11, wherein the first pattern is a photoresist pattern formed by lithography.

17. The manufacturing method of semiconductor device according to claim 11, wherein the thickness of the first mask layer is larger than the width of the trench and smaller than 1.5 times the width of the trench.

18. A manufacturing method of semiconductor device comprising:

forming at least one active region group on a semiconductor substrate, the active region group comprising a plurality of elliptical active regions surrounded by an element separation region, where a first direction is defined along the direction of the longer diameter of the elliptical active regions, and the plurality of active regions are arranged at equal intervals in a second direction intersecting the first direction;

forming a mask layer on a surface of the semiconductor substrate;

forming at least one first pattern having a line form on the mask layer so as to extend over the plurality of active regions constituting the active region group;

processing the mask layer using the first pattern as a base to form a plurality of second patterns at positions on both sides of and in contact with the first pattern;

forming a plurality of trenches on the semiconductor substrate within the active regions using the second patterns as a mask; and forming a gate electrode in the trenches to form a plurality of trench-gate MOS transistors in the active regions constituting the active region group, wherein each of the active regions is provided with a first diffusion layer region, a first gate electrode region, a second diffusion layer region, a second gate electrode region, and a third diffusion layer region, which are located in the direction of the longer diameter of each of the active regions, the forming at least one first pattern forms the one first pattern having a line form extending over the plurality of active regions, at a position corresponding to the second diffusion layer region, and wherein when a minimum dimension determined by a resolution limit of lithography is an F value, the width in the direction of the longer diameter of the first diffusion layer region, the first gate electrode region, the second diffusion layer region, the second gate electrode region, and the third diffusion layer region, which constitute each of the active regions, is identical to the F value, and the first pattern has a configuration such that the width of each line is identical to the F value and the pitch of the adjacent lines is six times the F value.

19. The manufacturing method of semiconductor device according to claim 18, wherein the processing the mask layer comprises:

sequentially laminating a third mask layer, a second mask layer, and a first mask layer on the surface of the substrate;

forming a fourth mask layer composed of the first pattern having a line form extending over the plurality of active regions and extending in the second direction so as to cover a plurality of the second diffusion layer regions of the active regions arranged in the second direction, on the first mask layer;

etching the first mask layer using the fourth mask layer as a mask to form the first pattern on the first mask layer;

removing the fourth mask layer used as the mask;

forming a sidewall layer on the second mask layer;

forming sidewalls by an etch-back, on both side walls of the first mask layer having the first pattern formed thereon and simultaneously exposing the upper surface of the first mask layer;

selectively removing the first mask layer, of which the upper surface is exposed, to form a pair of the second patterns which are composed of the sidewalls and correspond to the gate electrode;

etching the second mask layer using the pair of second patterns composed of the sidewalls as a mask to form the second patterns on the second mask layer;

removing the sidewalls used as the mask;

forming a fifth mask layer on the first mask layer and the second mask layer and removing the fifth mask layer formed on the second mask layer to expose the upper surface of the second mask layer, and selectively removing the second mask layer, of which the upper surface is exposed, to form the second pattern having a groove form in the fifth mask layer.

* * * * *